US006641662B2

United States Patent
Radojevic et al.

(10) Patent No.: US 6,641,662 B2
(45) Date of Patent: Nov. 4, 2003

(54) METHOD FOR FABRICATING ULTRA THIN SINGLE-CRYSTAL METAL OXIDE WAVE RETARDER PLATES AND WAVEGUIDE POLARIZATION MODE CONVERTER USING THE SAME

(75) Inventors: Antonije M. Radojevic, Mamaroneck, NY (US); Richard M. Osgood, Jr., Chappaqua, NY (US); Miguel Levy, Chassell, MI (US)

(73) Assignee: The Trustees of Columbia University in the City of New York, New York, NY (US)

( * ) Notice: Subject to any disclaimer, the term of this patent is extended or adjusted under 35 U.S.C. 154(b) by 0 days.

(21) Appl. No.: 09/821,862

(22) Filed: Mar. 30, 2001

(65) Prior Publication Data

US 2003/0010275 A1 Jan. 16, 2003

Related U.S. Application Data

(63) Continuation-in-part of application No. 09/618,433, filed on Jul. 18, 2000, which is a continuation-in-part of application No. 09/289,169, filed on Apr. 9, 1999, which is a continuation-in-part of application No. 09/025,114, filed on Feb. 17, 1998, now Pat. No. 6,120,957.

(60) Provisional application No. 60/193,961, filed on Mar. 31, 2000.

(51) Int. Cl.$^7$ .................................................. C30B 1/00
(52) U.S. Cl. .............................. 117/2; 117/3; 117/915; 438/406; 438/407; 438/408; 216/62; 216/87; 385/130
(58) Field of Search .................... 117/1, 2, 3, 915; 438/406, 407, 458; 216/62, 87; 383/130

(56) References Cited

U.S. PATENT DOCUMENTS 6,120,597 A  * 9/2000 Levy et al.

6,540,827 B1 * 4/2003 Levy et al. .................... 117/3
6,544,431 B2 * 4/2003 Gill et al. ..................... 216/87

OTHER PUBLICATIONS

Levy et al., "fabricationof single crystal lithium niobate films by crystal ion slicing", Applied Physics Letters, vol. 73, No. 16, 2293–2295 Oct. 19, 1998.*
Ramadan et al., "Electro–optic modulation in crystal ion sliced z cut LiNbO thin films", Applied Physics letters vol. 76 No. 11 pp. 1407–1409 Mar. 13, 2000.*

* cited by examiner

Primary Examiner—Robert Kunemund
(74) Attorney, Agent, or Firm—Baker Botts LLP

(57) ABSTRACT

A method for fabricating ultra-thin single-crystal metal oxide wave retarder plates, such as a zeroth-order X-cut single-crystal $LiNbO_3$ half-wave plate, comprises ion implanting a bulk birefringent metal oxide crystal at normal incidence through a planar major surface thereof to form a damage layer at a predetermined distance d below the planar major surface, and detaching a single-crystal wave retarder plate from the bulk crystal by either chemically etching away the damage layer or by subjecting the bulk crystal having the damage layer to a rapid temperature increase to effect thermally induced snap-off detachment of the wave retarder plate. The detached wave retarder plate has a predetermined thickness d dependent on the ion implantation energy. A half-wave plate fabricated in accordance with this method may be used in conjunction with an optical waveguide section to form a TE-TM polarization mode converter by mounting the half-wave plate in a groove in the wageguide section perpendicular to the direction of wave propagation therein, bonding the half-wave plate to the back-end facet of the waveguide section or bonding the half-wave plate to the front-end facet of the waveguide section. In each case the normal mode axes of the half-wave plate is at 45° with respect to the direction of the electric field vector of the TE or TM mode of propagation in the waveguide section.

74 Claims, 18 Drawing Sheets

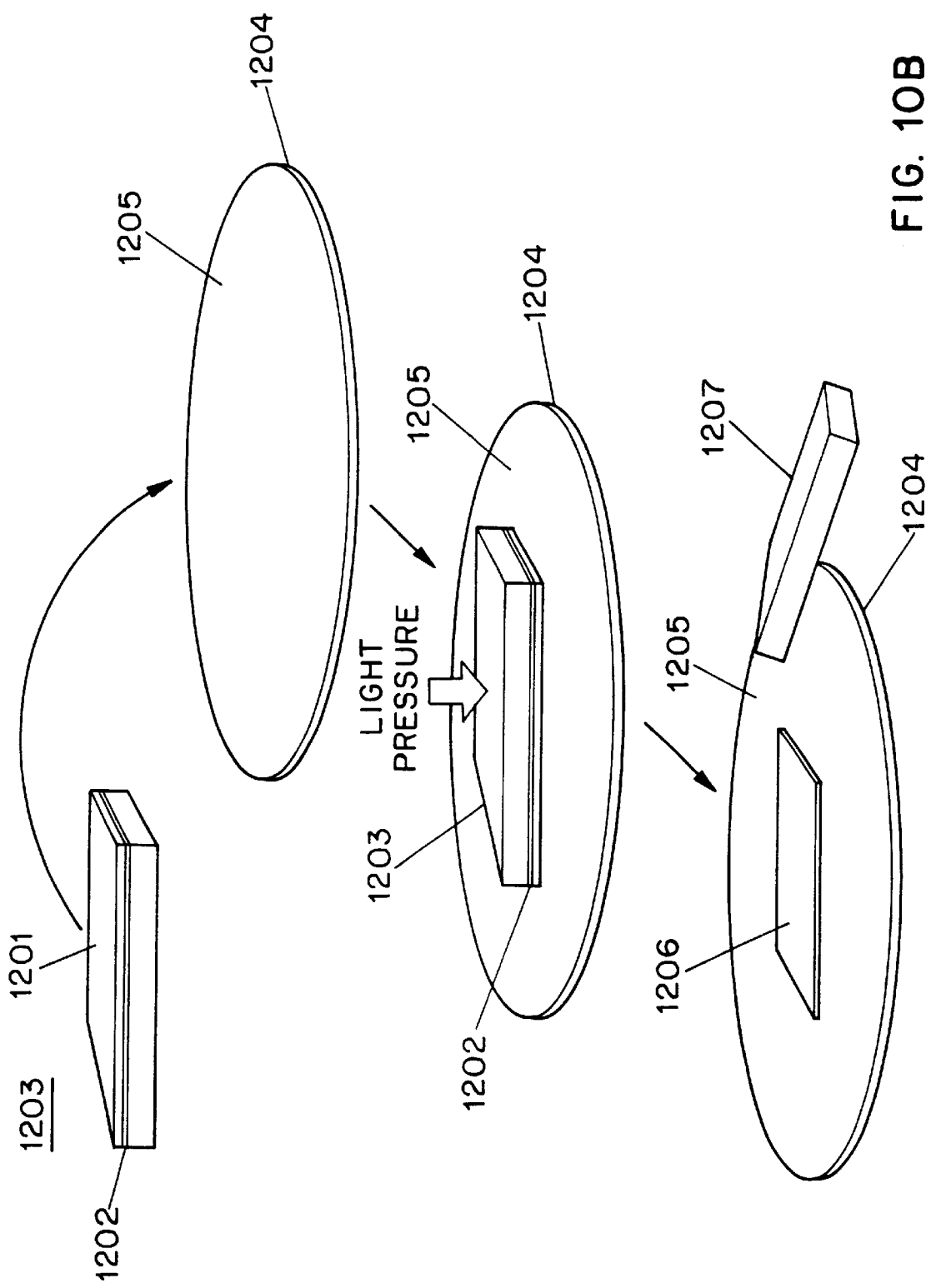

METHOD FOR FABRICATING ULTRA THIN SINGLE-CRYSTAL METAL OXIDE WAVE RETARDER PLATES AND WAVEGUIDE POLARIZATION MODE CONVERTER USING THE SAME

RELATED UNITED STATES APPLICATIONS

This application is a continuation-in-part of U.S. application Ser. No. 09/618,433, filed Jul. 8, 2000, which is in turn a continuation-in-part of U.S. application Ser. No. 09/289,169, filed Apr. 9, 1999, which is in turn a continuation-in-part application of U.S. application Ser. No. 09/025,114, filed Feb. 17, 1998 now U.S. Pat. No. 6,120,957. In addition, this application claims priority based on U.S. provisional Application Ser. No. 60/193,961, filed Mar. 31, 2000.

STATEMENT REGARDING FEDERALLY SPONSORED RESEARCH

The invention described herein was funded in part by a grant from AFOSR/DARPA Program, Contract No. F49620-99-1-0038, and in part by DARPA FAME Program, Contract No. N0017398-1-G014. The United States Government may have certain rights under the invention.

FIELD OF THE INVENTION

This invention relates in general to the field of fabricating ultra thin, birefringent metal oxide single-crystal films. More particularly, the invention relates to a method for fabricating single-crystal metal oxide wave retarder plates and the use of such wave retarder plates in optical waveguide polarization mode converters.

BACKGROUND OF THE INVENTION

Wave retarder plates, such as quarter-wave plates and half-wave plates, are components having important uses in manipulating polarization in optical systems. Such components depend on different phase changes that occur between the normal modes of a light wave propagating in anisotropic media rather than on selective refraction or absorption. Referring to FIG. 1, there is shown the index ellipsoid 1000 of an arbitrary anisotropic crystal having principal crystallographic axes X, Y and Z. For a plane wave propagating in the anisotropic crystal in an arbitrary direction defined by a unit vector $\vec{u}$, its two normal modes (i.e., the two orthogonal plane polarized components into which the plane wave may be decomposed) propagate at velocites $c_0/n_a$ and $c_0/n_b$, respectively, where $c_0$ is the velocity of the plane wave in vacuum, and $n_a$ and $n_b$ are the refractive indices along the minor and major normal mode axes 1001 and 1002 of the index ellipse 1003, respectively. The plane of the index ellipse 1003 is perpendicular to the unit vector $\vec{u}$. If $n_b > n_a$ and assuming that the two normal modes are in phase as they enter into the anisotropic crystal, a phase difference $\delta\phi$ between the two normal modes grows as they propagate through the crystal. The phase difference after the plane wave has propagated a distance d through the anisotropic crystal is:

$$\delta\phi = \frac{2\pi}{\lambda}[n_b(\lambda) - N_a(\lambda)]d. \quad (1)$$

The amplitudes of the two normal modes are $A\cos\theta$ and $A\sin\theta$, where $\theta$ is the angle between the incident plane of polarization and the major axis 1002 of the index ellipse 1003, and A is the amplitude of the incident plane wave. Combining the normal modes after a phase difference $\delta\phi$ produces a different state of polarization. For $\delta\phi=\pi/2$ the resulting polarization is an ellipse with its major axis parallel to the major axis 1002 of the index ellipse 1003, while for $\delta\phi=\pi$ the polarization is again plane but rotated by an angle of $2\theta$. In the particular case where $\theta=45°$ the ellipse becomes a circle, and circularly polarized light is produced, with the opposite hand of circular polarization obtained when $\theta=135°$. For $\delta\phi=\pi$ and $\theta=45°$, the plane of polarization is rotated by 90°.

Where the plane wave propagates along one of the principal crystallographic axis X, Y or Z, the normal modes have phase velocities of $c_0/n_2$ and $c_0n_3$, $c_0/n$, and $c_0/n_3$, and $c_0/n$, and $c_0/n_2$, respectively. For off-axis propagation (i.e., not along one of the principal crystallographic axes) the two normal modes which are orthogonally polarized relative to one another will be spatially displaced due to the "walk-off effect," where the two normal modes will be spatially displaced relative to one another after propagating a certain distance. However, for off-axis propagation in a thin anisotropic crystal having a thickness on the order of 10 $\mu$m, the spatial displacement, which is less than 0.3 $\mu$m, is small relative to the typical beam size used in integrated optics and can therefore be ignored. It is noted that the walk-off effect is not present when light is propagating along one of the three principal crystallographic axes X, Y or Z. Single crystal slabs having planar major surfaces perpendicular to one of the principal crystallographic axes X, Y and Z are referred to as X-cut, Y-cut and Z-cut crystals, respectively.

For a uniaxial birefringent crystal, such as a $LiNbO_3$ crystal, the Z principal crystallographic axis is referred to as the optic axis and $n_1 = n_2$. The normal modes for a uniaxial crystal are referred to as the ordinary mode and the extraordinary mode, respectively.

Birefringent single crystal slabs that produce phase differences of $$\delta\phi = \frac{\pi}{2}(2m+1)$$

and $\delta\phi=\pi(2m+1)$, where m=0, 1, 2, ..., are known as wave retarder plates, or more specifically quarter-wave plates and half-wave plates, respectively, where m is the order of the wave retarder plate.

Recently, zeroth order half-wave plates have been used in integrated optic circuits to provide TE-TM polarization mode converters. As described in Y. Inoue et al., "Polarization Mode Converter with Polyimide Half-Wave Plate in Silica-Based Planar Lightwave Circuits," IEEE Photon. Technol. Lett., Vol. 6, pp. 626–628, August 1994, an optical waveguide section that supports both TE and TM modes of propagation is provided with a groove perpendicular to the direction of light propagation in the optical waveguide section. A zeroth-order polyimide half-wave plate is inserted in the groove with its optic axis at 45° with respect to the electric field vector of the TE and the TM modes in the waveguide section, respectively. Using such an arrangement, a TE wave propagating through the half-wave plate is converted to a TM mode wave, and a TM wave propagating through the half-wave plate is converted to a TE mode wave. The Inoue et al. polarization mode converter uses a 14.5 $\mu$m thick zeroth-order half-wave plate made of polyimide and provides low-loss polarization-independent operation at 1550 nm with TE-TM conversion ratios of greater than 20 dB. However, polyimide plates are hygroscopic which adversely impacts the long term performance and stability of the polarization mode converter. In addition, because of its relatively low birefringence, polyimide half-wave plates are relatively thick, which increases the diffraction losses that normally become significant in waveguides with smaller guided mode size, as well as distortion of narrow pulses passing through the polyimide half-wave plate caused by dispersion in that material. Fabricating the half-wave plate using a material having a larger birefringence would permit the wave plate to be thinner, and therefore reduce the diffraction losses and dispersion.

The phase difference, $\delta\phi$ between the normal modes of a light wave after propagating through a wave plate may be expressed as of $\delta\phi=R2\pi$, where R is the optical retardance. For a half-wave plate $R=\frac{1}{2}(2m+1)$, and for a quarter-wave plate $R=\frac{1}{4}(2m+1)$, where $m=0, 1, 2 \ldots$. Therefore, the thickness d of a wave retarder plate may be expressed as $$d = \frac{R\lambda}{[n_b(\lambda) - n_a(\lambda)]}. \quad (2)$$

From equation (2) and the definitions of the optical retardance R, it is apparent that the thickness d of the wave retarder plate decreases with its order m and is inversely proportional to the difference between the indices of refraction $n_b(\lambda)$ and $n_a(\lambda)$ along the normal mode axes in the wave retarder plate, the difference being indicative of the degree of birefringence of the material of the wave retarder plate in the direction of light wave propagation.

As mentioned above, it is desirable for the thickness d of the wave retarder plate to be as small as possible in order to minimize the diffraction and attenuation losses, and dispersion. Therefore, it is desirable to fabricate wave retarder plates, preferably of zeroth order (m=0), from crystals having a large birefringence, such as birefringent metal oxide crystals including $LiNbO_3$, $LiIO_3$, $\beta-BaB_2O_4$ and $LiB_3O_5$. However, forming such ultra thin (e.g., $d=10.6\ \mu m$ for a zeroth-order $LiNbO_3$ half-wave plate at $\lambda=1550$ nm) wave retarder plates of birefringent metal oxide crystals where the wave retarder plate retains the optical properties of the bulk metal oxide crystal presents a heretofore unsolved problem.

SUMMARY OF THE INVENTION

In accordance with a first exemplary embodiment of the method of the present invention, there is provided a method for fabricating a wave retarder plate from bulk birefringent metal oxide crystal having a planar major surface oriented with respect to the principal crystallographic axes of the bulk crystal such that a plane light wave propagating in the bulk crystal in a direction perpendicular to the plane major surface has normal modes that travel at velocities $c_0/n_b$ and $c_0/n_a$, where $c_0$ is the velocity of the plane light wave in vacuum, $n_b$ and $n_a$ are the indices of refraction along the normal mode axes of the index ellipse, respectively, and $n_b>n_a$. The method comprises implanting ions into the bulk crystal at normal incidence through the planar major surface in a direction perpendicular thereto to form a damage layer at an implantation depth d below the planar major surface. The planar major surface and the damage layer define the wave retarder plate to be "sliced" from the bulk crystal. The implantation depth d is given by the relation $$d = \frac{R\lambda}{[n_b(\lambda) - n_a(\lambda)]},$$

where R is the optical retardance of the wave retarder plate being formed, $\lambda$ is the wavelength of light for which the wave retarder plate is designed to be used. The method further comprises chemically etching the damage layer to effect detachment of the wave retarder plate from the bulk crystal.

According to a second exemplary embodiment of the method of the present invention, the same implanting step used in the first exemplary embodiment is used in the second exemplary embodiment. After the implanting step, the bulk crystal having the damage layer is exposed to a rapid temperature increase to effect detachment of the wave retarder plate from the bulk crystal without chemical etching.

According to a third exemplary embodiment of the method of the present invention, the same implanting step used in the first and second exemplary embodiments is used in the third exemplary embodiment. After the implanting step the bulk crystal having the damage layer is bonded to a substrate, and the bulk crystal having the damage layer is exposed to a rapid temperature increase to effect detachment of the wave retarder plate from the bulk crystal. In one variation of the third exemplary embodiment, the substrate has a first flat and polished planar major surface, and the bonding step comprises placing the planar major surface of the bulk crystal having the damage layer in contact with a first surface of the substrate. The bulk crystal having the damage layer and the substrate are then subjected to moderate heating while using a relatively light force to hold the planar surface of the bulk crystal having the damage layer against the first surface of the substrate for a sufficiently long time to effect bonding of the bulk crystal having the damage layer to the substrate. Thereafter, the bulk crystal having the damage layer is subjected to a rapid temperature increase to effect detachment of the wave retarder plate from the bulk crystal. The substrate having the detached wave retarder plate bonded thereto may be immersed in methanol or water to cause the detached wave retarder plate to be released from the substrate.

In another variation of the third exemplary embodiment the substrate is a borosilicate glass plate having a first flat and polished surface, and the bonding step comprises placing the major planar surface of the bulk crystal having the damage layer in contact with the first surface of the substrate. The bulk crystal and the substrate are then placed between metal electrodes to which pressure is applied to hold the planar major surface of the bulk crystal against the first surface of the substrate while applying a high voltage between the bulk crystal and the substrate to effect releasable anodic bonding between the planar surface of the bulk crystal and the first surface of the substrate. After the bonding, the bulk crystal having the damage layer is subjected to a rapid temperature increase to effect detachment of the wave retarder plate from the bulk crystal. The substrate having the detached wave retarder plate bonded thereto may then be immersed in methanol or water to cause the release of the detached wave retarder plate from the substrate.

According to a fourth exemplary embodiment of the method of the present invention, the same implanting step used in the first, second and third exemplary embodiments is used in the fourth exemplary embodiment. After the implanting step the bulk crystal having the damage layer is subjected to a rapid thermal anneal before chemically etching the damage layer to effect detachment of the wave retarder plate from the bulk crystal. The rapid thermal anneal has the effect of greatly reducing the time required to etch away the damage layer.

In another aspect of the present invention, there is provided an optical waveguide polarization mode converter comprising a section of optical waveguide that supports both TE and TM modes of light wave propagation and that has a groove formed therein perpendicular to the direction of light propagation in the optical waveguide section. A zeroth order $LiNbO_3$ half-wave plate formed by the first, second, third or fourth exemplary embodiment of the method of the present invention is inserted in the groove of the section of optical waveguide. The half-wave plate is oriented such that the normal mode axes thereof are oriented at 45° with respect to the direction of the electric field vector of the TE or TM mode of propagation in the section of optical waveguide.

BRIEF DESCRIPTION OF THE DRAWINGS

For a complete understanding of the present invention and the advantages thereof, reference is now made to the following description taken in conjunction with the accompanying drawings in which like reference numbers indicate like features, components and method steps, and wherein:

FIG. 10B shows isometric views illustrating an exemplary implementation of the method of FIG. 9, wherein the planar major surface of an ion implanted bulk birefringent metal oxide crystal is bonded directly to a first surface of a doped semiconductor substrate before and after the bonded bulk crystal having an ion implanted damage layer is subjected to a rapid temperature increase to effect detachment of the wave retarder plate from the bulk crystal, the detached wave retarder plate remaining bonded to the substrate;

DETAILED DESCRIPTION OF THE INVENTION

Figure 1:
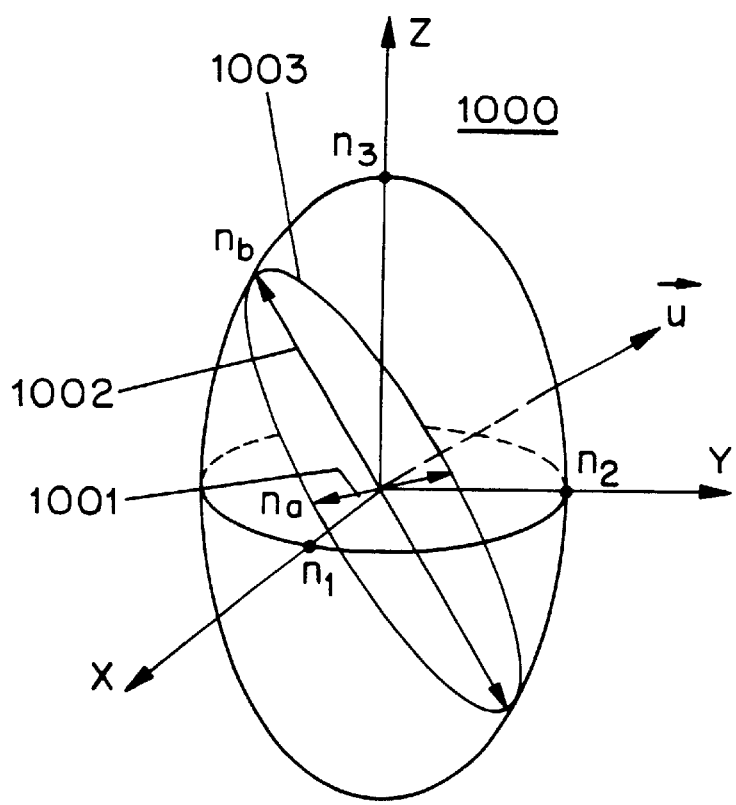
FIG. 1 is a depiction of the index ellipsoid of an anisotropic crystal with a plane wave propagating in an arbitrary direction therein.
Figure 2:
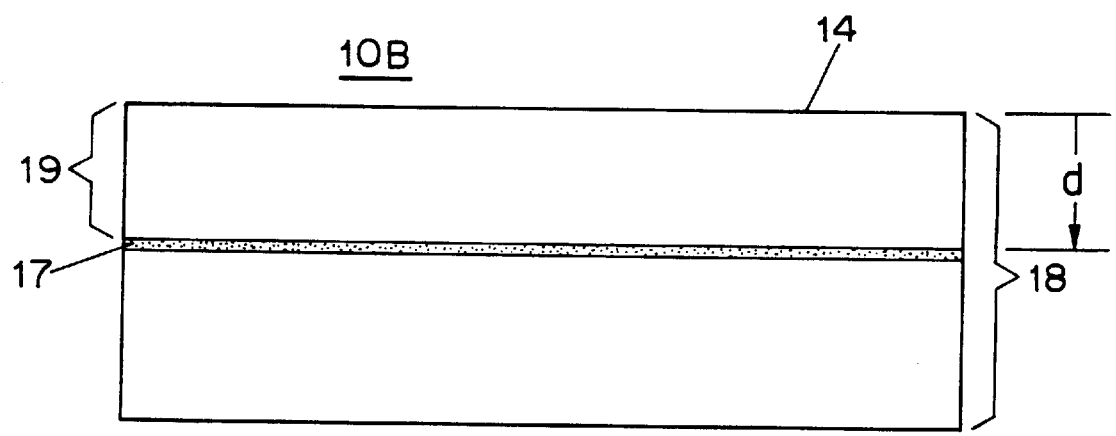
FIG. 2 is a side view of a bulk birefringent metal oxide crystal having a planar major surface and a damage layer created by ion implantation located at a distance d below the planar major surface, the planar major surface and the damage layer defining the wave retarder plate to be "sliced" from the bulk crystal.

Referring to FIG. 2, there is shown a side view of a bulk birefringent metal oxide crystal 18 having a planar major surface 14 oriented with respect to the principal crystallographic axes of the bulk crystal such that a light wave of normal incidence to the planar major surface propagates through the bulk crystal in two normal modes of orthogonal polarization at respective velocities of $c_0/n_a$ and $c_0/n_b$, where $n_a$ and $n_b$ are the indices of refraction of the two normal modes, respectively, and $n_b > n_a$. The bulk crystal 18 has a damage layer 17 formed therein at a depth d below the planar major surface 14. The planar major surface 14 and the damage layer 17 define a wave retarder plate 19 to be detached from the bulk crystal 18. The thickness of the wave retarder plate d is given by equation (2). The damage layer 17 is formed by ion implantation as will be explained in detail hereinbelow.

The bulk crystal 18 may be any single-crystal birefringent (uniaxial or biaxial) metal oxide crystal, such as single-crystal LiNbO₃, LiIO₃, β-BaB₂O₄ and LiB₃O₅. In order to produce a thin zeroth-order wave retarder plate having a thickness on the order of 10 μm, the bulk crystal material has to exhibit a large degree of birefringence. The larger the birefringence of the bulk crystal material and the lower the order of the wave retarder plate, the thinner is the wave retarder plate to be detached from the bulk crystal 18. If the birefringence of the bulk crystal material is too large at a particular wavelength, the required thickness for a zeroth order wave retarder plate may be too thin for practical handling, and a higher order wave retarder plate or one in which the crystallographic orientation is changed to give a smaller birefringence must be formed. Conversely, using a bulk crystal material having a small degree of birefringence at a particular wavelength will result in a thicker wave retarder plate even at zeroth order, as in the case of LiTaO₃ where a zeroth-order half-wave plate made from that material will have a thickness of approximately 185 μm at a wavelength of 1550 nm, thus making a LiTaO₃ half-wave plate impractical for integrated optics applications.

Figure 3:
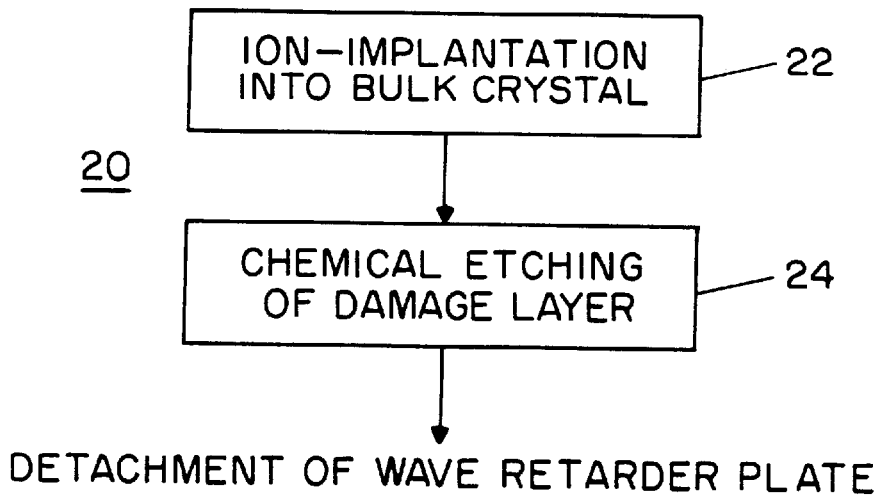
FIG. 3 is a flow diagram representing the steps of detaching a single-crystal wave retarder plate from a bulk birefringent metal oxide crystal according to an exemplary embodiment of the method of the present invention.

Turning now to FIG. 3, there is shown a flow diagram representing an exemplary embodiment of the method of the present invention for detaching a thin wave retarder plate from a bulk birefringent metal oxide crystal. The method includes the steps of implanting ions into the bulk crystal at normal incidence through a planar major surface of the bulk crystal to form a damage layer in the bulk crystal below the planar major surface (step 22), and then preferentially etching the damage or "sacrificial," layer in the bulk crystal (step 24) to effect detachment of the wave retarder plate from the bulk crystal. Advantageously, the etching step is carried out using a liquid chemical etchant.

Figure 4:
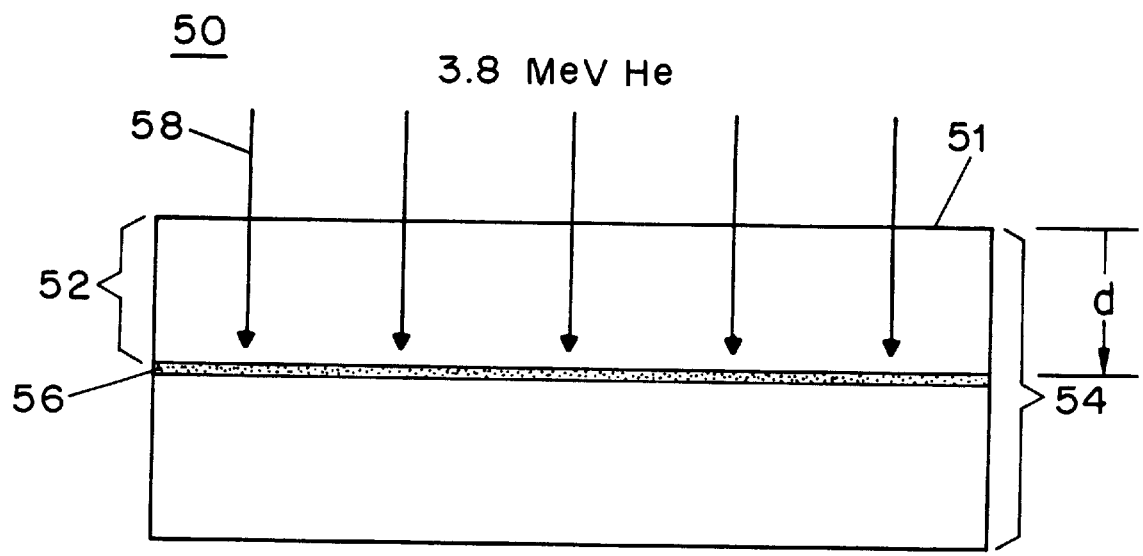
FIG. 4 is a side view of a bulk birefringent metal oxide crystal being subjected to ion implantation at normal incidence through a planar major surface of the bulk crystal to create a damage layer at a distance d below the planar major surface such that the planar major surface and the damage layer define the wave retarder plate to be detached from the bulk crystal.

Referring to FIG. 4, elemental ions 58, such as energetic helium or hydrogen ions, for example, are implanted at a predetermined energy into the bulk birefringent metal oxide crystal 54 through a planar major surface 51 of the bulk crystal. The direction of ion implantation is normal to the planar major surface 51. The ions implanted into the bulk crystal 54 can also be chemically reactive ions, such as hydrogen or boron, that react with the material of the bulk crystal 54. The ions are implanted into the bulk crystal 54 such that a damage layer 56 is formed at a depth d below the planar major surface 51 of the bulk crystal 54. In the example of FIG. 4, the implanted ions are singly-ionized helium ions 58 having a kinetic energy of approximately 3.8 MeV.

The ion implantation step introduces lattice defects in the bulk crystal 54 to form the damage layer 56. The lattice defects are introduced by the transfer of momentum from the implanted ions to target nuclei in the bulk crystal lattice, and such lattice defects are generally formed near the end of the ionic trajectories. Depending upon the selected implantation species and the kinetic energy of the ions, the lattice defects, and thus the damage layer 56, are introduced into the bulk crystal 54 at a depth d below the major planar surface 51 of the bulk crystal 54.

The required thickness of the wave retarder plate being formed is therefore determined by the kinetic energy of the implanted ions 58, which can be varied as required to provide the desired wave retarder plate thickness d. The damage layer, or "sacrificial" layer, enables the single-crystal wave retarder plate 52 to be "sliced off" from the bulk crystal 54. Table 1 gives the implantation depth and the implantation energies for forming half-wave plates and quarter-wave plates designed for various wavelengths λ of light from X-cut or Y-cut $LiNbO_3$ bulk crystals implanted with $He^+$ ions. Table 2 gives the ion implantation depth d, the ion implantation energies for forming half-wave plates and quarter-wave plates designed for various wavelengths λ of light from X-cut and Y-cut $\beta\text{-}BaB_2O_4$ implanted with $He^+$ ions.

scattering and is characterized by the Lindhard-Scharff-Schiott (LSS) theory. The LSS theory predicts a stopping power proportional to $\sqrt{E}$ where E is the kinetic energy of the implanted ions along its trajectory for high energy ions. At low energies the "stopping power" is inversely proportional to $E^2$ and is primarily characterized by Rutherford scattering with the host nuclei.

Referring again to the exemplary method represented by the flow diagram of FIG. 3, the ion implantation step 22 is followed by a chemical etching step 24 for removing the damage, or "sacrificial," layer 76 (shown in FIG. 5A) from the bulk crystal. Advantageously, the chemical etching step is liquid chemical etching which provides for a very large differential etching rate as between the damage layer and the undamaged bulk crystal. Once the damage layer is removed

TABLE 1

X- or Y-cut $LiNbO_3$ Implanted with $He^+$

| Half-wave Plate (R = 0.5) | | | Quarter-wave Plate (R = 0.25) | | |
| --- | --- | --- | --- | --- | --- |
| Wavelength, λ[μm] | Thickness d[μm] | Implantation Energy [MeV] | Wavelength, h, λ[μ] | Thickness d[μm] | Implantation Energy [MeV] |
| 1.550 | 10.59 | 4.00 | 1.550 | 5.30 | 2.28 |
| 1.500 | 10.21 | 3.86 | 1.500 | 5.11 | 2.21 |
| 1.470 | 9.98 | 3.80 | 1.470 | 5.00 | 2.17 |
| 1.300 | 8.72 | 3.40 | 1.300 | 4.36 | 1.91 |
| 1.064 | 6.98 | 2.87 | 1.064 | 3.50 | 1.55 |
| 0.980 | 6.37 | 2.66 | 0.980 | 3.20 | 1.40 |
| 0.800 | 5.04 | 2.17 | 0.800 | 2.52 | 1.06 |
| 0.633 | 3.78 | 1.66 | 0.633 | 1.90 | 0.75 |

TABLE 2

X- or Y-cut $\beta\text{-}BaB_2O_4$ Implanted with $He^+$

| Half-wave Plate (R = 0.5) | | | Quarter-wave Plate (R = 0.25) | | |
| --- | --- | --- | --- | --- | --- |
| Wavelength, λ[μm] | Thickness d[μm] | Implantation Energy [MeV] | Wavelength, λ[μm] | Thickness d[μm] | Implantation Energy [MeV] |
| 1.550 | 6.71 | 2.32 | 1.550 | 3.35 | 1.23 |
| 1.500 | 6.50 | 2.25 | 1.500 | 3.25 | 1.17 |
| 1.300 | 5.64 | 1.99 | 1.300 | 2.82 | 1.00 |
| 1.064 | 4.61 | 1.66 | 1.064 | 2.30 | 0.78 |
| 0.980 | 4.24 | 1.54 | 0.980 | 2.12 | 0.66 |
| 0.800 | 3.44 | 1.26 | 0.800 | 1.72 | 0.54 |
| 0.633 | 2.70 | 0.95 | 0.633 | 1.34 | 0.37 |

A typical implantation dose for singly ionized 4.0 MeV helium ions 58 is approximately $2.25 \times 10^{16}$ $cm^{-2}$ for forming an X-cut or Y-cut $LiNbO_3$ half-wave plate for λ=1.55 μm. It was found that for implantation in the direction of a minor crystallographic axis (i.e., the X axis or the Y axis) a dose of approximately $5 \times 10^{16}$ $cm^{-2}$ will cause shattering of the wave retarder plate. During ion implantation, the bulk crystal samples are mounted on a specially designed 2-inch diameter water-cooled target holder (not shown) to insure that the temperature of the substrate is below 400°.

Figure 5A:
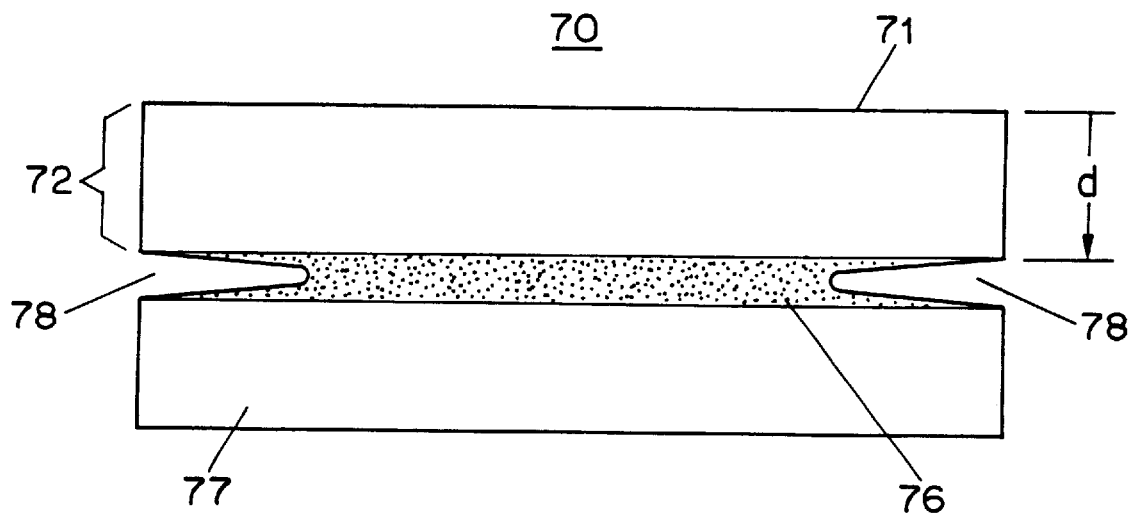
FIGS. 5A and 5B are side and top views, respectively, showing the etching step according to the exemplary embodiment of FIG. 3.
Figure 5B:
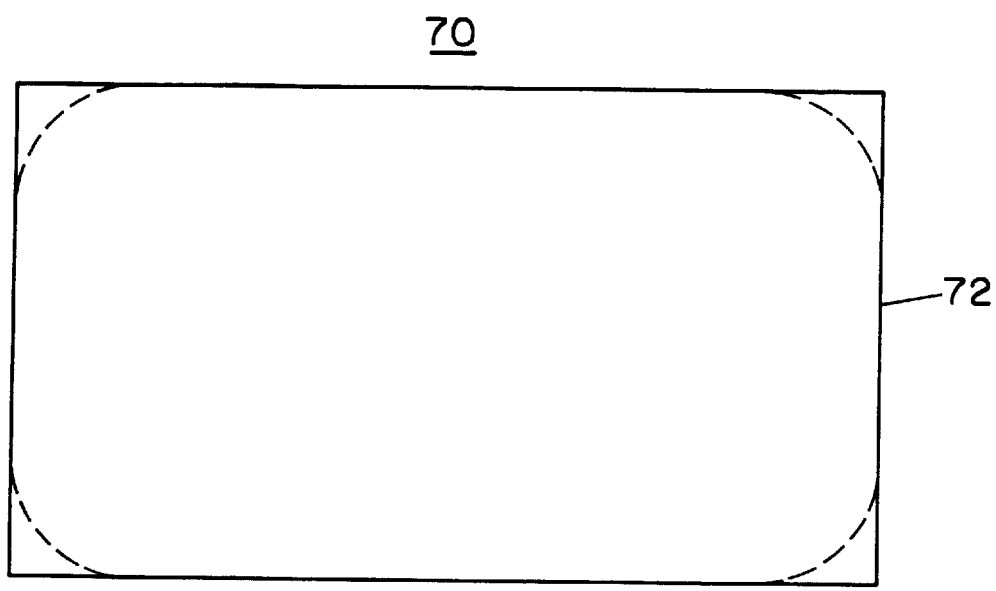

In the exemplary method as illustrated in FIGS. 3 and 4, a low atomic weight implantation species, preferably helium, is advantageously chosen to provide a damage layer at a desired depth below the planar major surface 51. In addition, helium ions are desirable because of the resulting implantation profile and the distribution of lattice damage in the crystal, which in turn is determined by the energy loss per unit trajectory length, or "stopping power." At high ionic energies, the "stopping power" is dominated by electronic by the chemical etching step, the wave retarder plate 72 (shown in FIGS. 5A and 5B) is detached from the bulk crystal. Turning to FIGS. 5A and 5B, there are shown a side view and a top view, respectively, of the damage layer and the rest of the bulk crystal during the etching step in the exemplary method of FIG. 3. As shown in FIG. 5A, when the bulk crystal having the damage layer is immersed in an appropriate chemical etchant, after an appropriate etching period, the damage layer 76 is etched away, and the wave retarder plate 72 is detached from the bulk crystal 77. In the case of the bulk crystal being a $LiNbO_3$ single crystal the etchant is advantageously 5% diluted hydrofluoric acid, and etching is performed at room temperature for 24 hours or less for the detaching a 1 $mm^2$ wave retarder plate from the bulk crystal.

As shown in FIG. 5A, a deep undercut 78 forms in the bulk crystal after several hours of exposure to the chemical etchant. The differential etch rate between the damage layer and the rest of the bulk crystal is determined by comparing the etch rate of the undercut 78 to that of the planar major surface 71 exposed to the same etching conditions. The latter is determined by masking a section of the planar major surface with silicon dioxide and measuring the extent of etching with a profilometer. The degree of undercut is measured using Nomarski prism microscopy, or by cleaving off a section of the single crystal overhang. The etch selectivity, which is defined as the ratio of the etch rate of the damage layer to the etch rate of the planar major surface, is found to be in excess of $10^4$.

Referring again to the exemplary embodiment represented by the flow diagram of FIG. 3, the chemical etching step may however result in residual lattice damage, surface roughening or corner fracturing of the major planar surface of the single-crystal wave retarder plate. For example, corner fracturing may occur during the chemical etching step as shown by broken lines in FIG. 5B. Consequently, additional protective measures are required to minimize damage to the wave retarder plate and to insure the production of high quality wave retarder plates.

Figure 6:
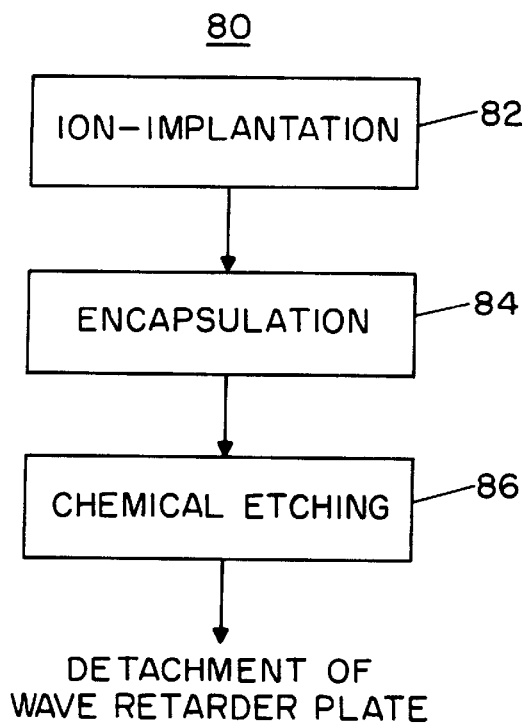
FIG. 6 is a flow diagram representing another exemplary embodiment of the method of the present invention for slicing a wave retarder plate from a bulk birefringent metal oxide crystal, in which encapsulation is used to minimize damage to the wave retarder plate during detachment by chemical etching.

Turning now to FIG. 6, there is shown a flow diagram representing further exemplary embodiment 80 of the method of the present invention for forming a single-crystal wave retarder plate from a bulk crystal whereby residual lattice damage and surface roughening is minimized by encapsulation. The exemplary method 80 includes the steps of implanting ions into the bulk crystal through a planar major surface thereof in a normal direction to form a damage layer at a predetermined depth below the planar major surface of the bulk crystal (step 82), encapsulating the planar major surface of the single crystal wave retarder plate (step 84), and chemically etching the implanted bulk crystal to remove the damage layer (step 86). According to the present exemplary embodiment, the corners of the single crystal wave retarder plate 72 of FIGS. 5A and 5B are encapsulated with a molten wax or an Apiezon W mixture to prevent fracturing of the single-crystal wave retarder plate due to the residual lattice damage and the surface roughening caused by the subsequent chemical etching step.

Figure 7:
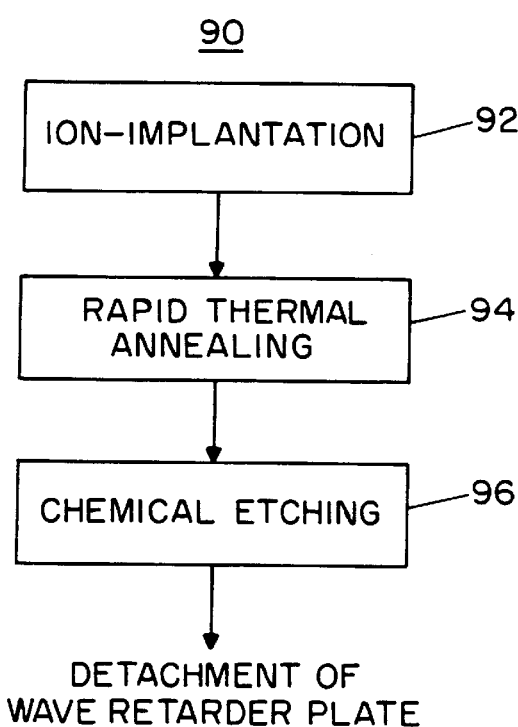
FIG. 7 is a flow diagram representing a further exemplary embodiment of the method of the present invention for fabricating a wave retarder plate from a bulk birefringent metal oxide crystal, in which a rapid thermal annealing step is carried out after the ion implanting step to facilitate detachment of the wave retarder plate from the bulk crystal in a chemical etching step.

Referring to FIG. 7, there is shown a flow diagram representing yet another exemplary embodiment of the present invention for forming wave retarder plates from a bulk birefringent metal oxide crystal, in which residual lattice damage and surface roughening is minimized by subjecting the implanted bulk crystal to a rapid thermal anneal (RTA). As will be explained in further detail hereinbelow, the rapid thermal anneal will also greatly reduce the time required to etch away the damage layer. The exemplary method 90 includes the steps of implanting ions into the bulk crystal at normal incidence through a planar major surface thereof to form a damage layer within the bulk crystal (step 92), rapid thermal annealing the bulk crystal having the damage layer (step 94) and chemically etching the bulk crystal having the damage layer to effect detachment of the wave retarder plate from the bulk crystal (step 96). As in the previous exemplary embodiments, the planar major surface of the bulk crystal is oriented with respect to the crystallographic axes of the bulk crystal such that a plane polarized light wave at normal incidence with respect to the planar major surface propagates through the bulk crystal in two normal modes having respective different velocities. Advantageously, the chemical etching step comprises liquid chemical etching.

As shown in FIG. 7, the rapid thermal annealing step (step 94) is performed after the ion implantation step (step 92) and before the chemical etching step (step 96). The rapid thermal annealing step serves to repair the residual damage caused by ion implantation without compromising the efficiency of the subsequent differential etching of the damage layer. It has been found that a 40 second anneal at 700° C. in forming gas comprising 5% hydrogen and 95% nitrogen results in a smooth surface and thus a high quality single-crystal wave retarder plate. By contrast, rapid temperature annealing performed at temperatures above 800° C. is undesirable since it significantly reduces the etch rate of the damage layer by annealing out the lattice damage caused by the ion implantation. Consequently, the exemplary method represented by the flow diagram of FIG. 7 including the rapid thermal annealing step (step 94) preformed at approximately 800° C. will reduce the etch rate of the damage layer to be less than that which is obtained without the rapid temperature annealing step (step 94).

Referring again to the exemplary method represented by the flow diagram of FIG. 3, the duration of the chemical etching step 24 is nominally 24 to 28 hours depending upon the size of the wave retarder plate being detached. For example, to fully detach a 1×1 mm² area wave retarder plate from a bulk crystal, the bulk crystal having the damage layer must be exposed to the etchant for approximately 24 to 48 hours. As will be described in detail hereinbelow, this etching time may be reduced by as much as a factor of 100 by subjecting the bulk crystal with the damage layer to a rapid thermal annealing step prior to the chemical etching step as in the exemplary method represented by the flow diagram of FIG. 7.

Figure 8:
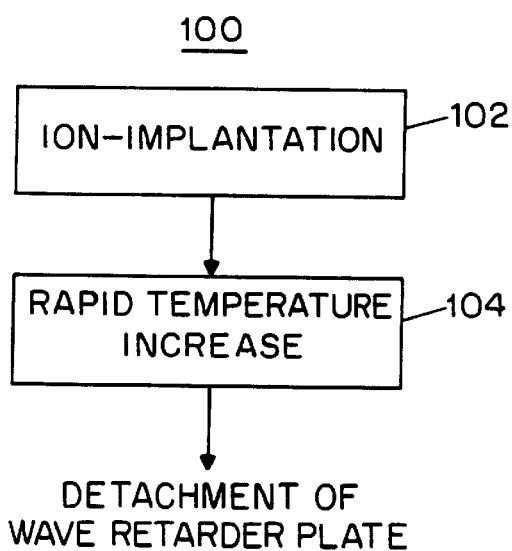
FIG. 8 is a flow diagram representing yet another exemplary embodiment of the method of the present invention for slicing a wave retarder plate from a bulk birefringent metal oxide crystal where after the ion implanting step the bulk crystal having the damage layer is subjected to a rapid temperature increase to effect detachment of the wave retarder plate from the bulk crystal without chemical etching.

However, a faster alternative to the exemplary methods of FIGS. 3 and 7, FIG. 8 shows a flow diagram representing still another exemplary embodiment of the method of the present invention for forming a single crystal wave retarder plate. Referring to FIG. 8, the exemplary method 100 includes the steps of implanting ions into a bulk birefringent metal oxide crystal at normal incidence through a planar major surface thereof to form a damage layer within the bulk crystal (step 102), and subjecting the bulk crystal having the damage layer to a rapid temperature increase so as to effect detachment or "snap-off" of the single crystal wave retarder plate from the bulk crystal (step 104). As in the other exemplary embodiments, the planar major surface of the bulk crystal is oriented with respect to the crystallographic axes of the bulk crystal such that a plane polarized light wave normally incident with respect to the planar major surface propagates through the bulk crystal in two normal modes having respective different velocities. It is noted that in the present embodiment, the rapid temperature increase causes the detachment or snap-off of the single crystal wave retarder plate from the bulk crystal without chemical etching. Step 104 of FIG. 8 includes raising the temperature of the bulk crystal having the damage layer from room temperature to a temperature in the range of 500 to 800° C. within 30 seconds. Detachment of the single crystal wave retarder plate is thereby achieved by maintaining the temperature of the bulk crystal having the damage layer in the range of 500 to 800° C. for approximately 30 seconds. The optimal temperature will depend on the specific crystallographic orientation and implantation dose.

As an additional step to the exemplary embodiment represented by the flow diagram of FIG. 8, the bulk crystal may be chemically treated during or before the ion implantation step 102 with a chemical agent, such as chlorine gas or liquid, to enhance snap-off detachment of the single-crystal wave retarder plate. Chemical treatment of the damage layer may also be performed so as to minimize the degree of the rapid temperature increase required to effect snap-off detachment of the single crystal wave retarder plate from the bulk crystal.

Figure 9:
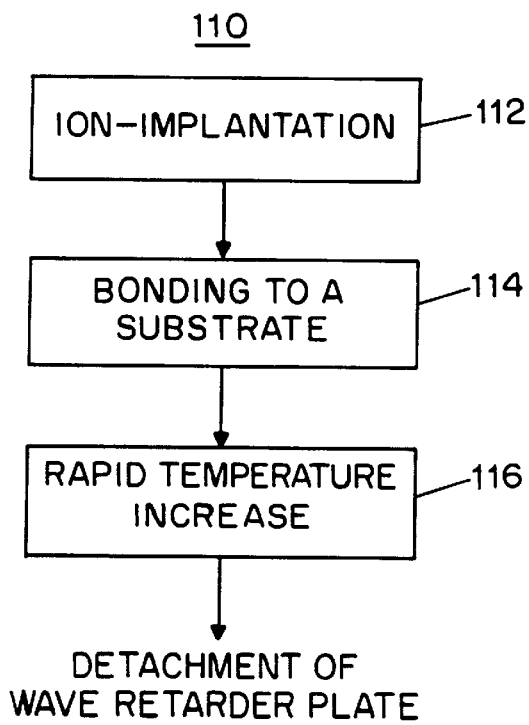
FIG. 9 is a flow diagram representing still another exemplary embodiment of the method of the present invention for fabricating a wave retarder plate from a bulk birefringent metal oxide crystal, in which after the ion implanting step the planar major surface of the bulk crystal is bonded to a substrate prior to exposing the bulk crystal having the damage layer to a rapid temperature increase to effect detachment of the wave retarder plate from the bulk crystal, the detached wave retarder plate remaining bonded to the substrate.

Turning now to FIG. 9, there is shown a flow diagram representing a further exemplary embodiment of the method of the present invention for forming a single-crystal wave retarder plate from a bulk birefringent metal oxide crystal. The method 110 includes the steps of implanting ions into the bulk crystal at normal incidence through a planar major surface thereof to form a damage layer within the bulk crystal at an appropriate depth below the planar major surface (step 112), bonding the planar major surface of the bulk crystal, either directly or indirectly, to a substrate (step 114), and subjecting the bulk crystal having the damage layer to a rapid temperature increase so as to effect snap-off detachment of a single crystal wave retarder plate from the bulk crystal (step 116) without chemical etching. As with the exemplary method represented by the flow diagram of FIG. 8, the rapid temperature increase step (step 116) includes raising the temperature of the bulk crystal having the damage layer from room temperature to a temperature in the range of 500 to 800° C. within 30 seconds. Detachment of the single crystal wave retarder plate is thereby achieved by maintaining the temperature of the bulk crystal having the damage layer at approximately 500 to 800° C. for approximately 30 seconds. The optimal temperature will depend on the crystallographic orientations and the implantation dose.

During the bonding step (step 112), the planar major surface of the bulk crystal is advantageously bonded directly but releasably to a first surface of a substrate. The substrate may be of the same material as or a different material from that of the bulk crystal. Alternatively, the bonding step (step 114) of the exemplary method represented by the flow diagram of FIG. 9 may include bonding the planar major surface of the bulk crystal having the damage layer to a first surface of a substrate by using a high melting temperature bonding layer which can be removed, for example by a solvent, after snap-off detachment of the wave retarder plate from the bulk crystal during the rapid temperature increase (step 116) to effect release of the detached wave retarder plate from the substrate. As in the other exemplary embodiments, the planar major surface is oriented with respect to the crystallographic axes of the bulk crystal such that a plane polarized light wave normally incident on the planar major surface propagates in the bulk crystal in two normal polarization modes at respective different velocities, and the damage layer is formed at a distance d below the planar major surface, where d is given by equation (2).

Figure 10:
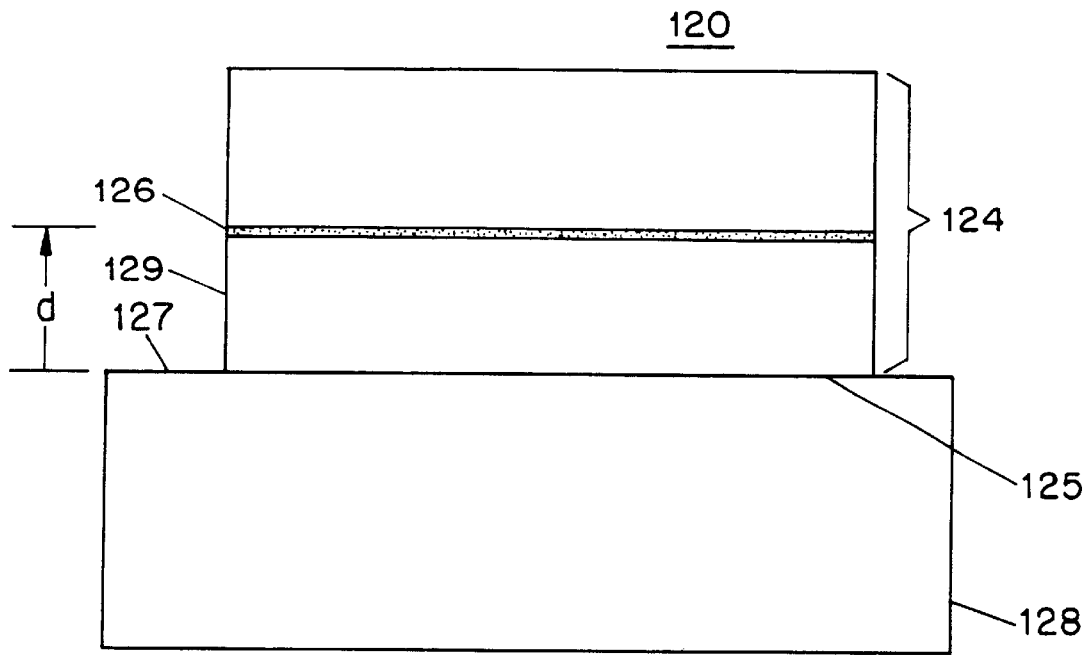
FIG. 10 is a side view showing a bulk birefringent metal oxide crystal having a damage layer according to the method of FIG. 9, wherein the planar major surface of the bulk crystal is bonded directly to a first surface of a substrate.

Referring to FIG. 10, there is shown a side view of a bulk birefringent metal oxide crystal 124 having a damage layer 126 formed at a distance d from a planar major surface 125 of the bulk crystal 124, where the planar major surface 125 is releasably or permanently bonded directly to a first surface 127 of a substrate 128. The substrate 128 may be the same material as or a different material from that of the bulk crystal 124. After detachment of the wave retarder plate 129 from the bulk crystal 124 by subjecting the bulk crystal 124 having the damage layer 126 to a rapid temperature increase step, the detached wave retarder plate 129 remains bonded to the substrate 128, but may be released from the substrate 128 by immersing the substrate 128 having the releasably bonded detached wave retarder plate 129 in methanol or water.

Figure 10A:
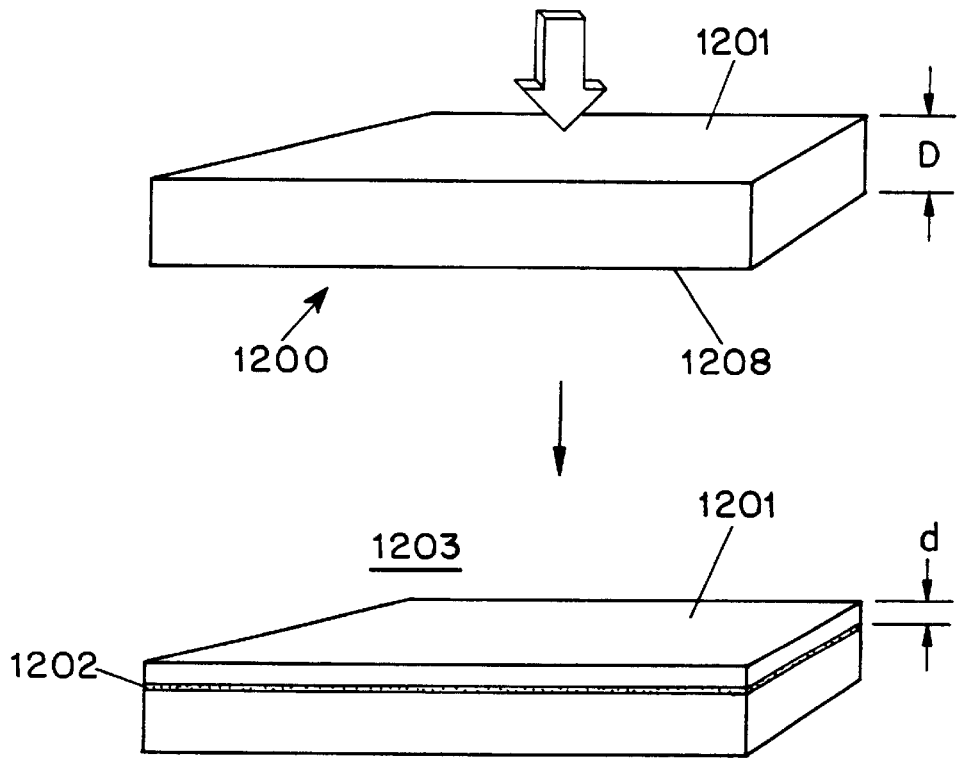
FIG. 10A are isometric views of a bulk birefringent metal oxide crystal before and after ion implantation at normal incidence through a planar major surface of a bulk birefringent metal oxide crystal to form a damage layer in the bulk crystal at a distance d below the planar major surface thereof.

Referring to FIGS. 10A and 10B, there are shown a further exemplary implementation of the method represented by the flow diagram of FIG. 9. In FIG. 10A, a bulk single crystal wafer 1200 of X-cut LiNbO$_3$ having a thickness D of approximately 0.5–1 mm is first subjected to ultrasonic cleaning (not shown) in acetone and methanol. Thereafter, 50 nm of Cr or Al is evaporated on the backside 1208 of the bulk single-crystal wafer. The bulk single crystal wafer is then mounted on a metal substrate (not shown) using a layer of silver epoxy between the substrate and the metallized backside of the bulk single-crystal wafer. The bulk single-crystal wafer is then ion implanted. Choosing the implantation energy, implantation dose and the ion species depends on the material of the bulk single crystal, and in certain materials they also depend on the crystallographic orientation.

In the case where an X-cut LiNbO$_3$ half-wave plate designed for a wavelength of 1.55 µm is being formed, the X-cut LiNbO$_3$ bulk single-crystal wafer is implanted with He$^+$ ions at a dose of approximately $2.25 \times 10^{16}$ cm$^{-2}$ at an energy of 4.0 MeV, so that a damage layer is formed at a depth d that corresponds to the thickness of a half-wave plate designed for a wavelength of 1.55 µm.

After ion implantation, the implanted LiNbO$_3$ bulk single-crystal wafer is cut into rectangular samples 1203 of desired dimensions, and with the optic axis of the sample oriented at an appropriate angle relative to the two sides of the rectangle. For example, if the half-wave plate is to be used to provide a 90° rotation of incident plane polarized light, the optic axis is advantageously oriented at 45° relative to either one of the two sides of the rectangular shape sample 1203. It is noted that the implanted bulk single-crystal wafer may be cut into samples of any shape, including disks.

After the ion implanted LiNbO$_3$ bulk single-crystal wafer is cut into samples 1203, the implanted surface 1201 of each sample 1203 is polished as necessary to be flat and smooth. The prepared samples 1203 are then ultrasonically cleaned in acetone, methanol and distilled water to produce a clean, flat and smooth implanted surface 1201. Turning to FIG. 11B, a wafer of doped semiconductor material, such as doped silicon covered by a thin coating of native silicon dioxide and having a flat polished surface, is ultrasonically cleaned in acetone, methanol and distilled water. It is noted that for both the LiNbO$_3$ samples and the semiconductor substrate, cleaning of the implanted surface 1201 and the polished flat substrate surface 1205 may be carried out using other suitable solvents and cleaning agents known to those skilled in the art.

After both the ion implanted sample 1203 and the semiconductor substrate 1204 are properly cleaned, the implanted sample 1203 is turned upside down so that the implanted surface 1201 is in contact with the polished flat surface 1205 of the semiconductor substrate 1204. With the ion implanted sample 1203 placed on the semiconductor substrate 1204 in this manner, both the sample and the substrate are placed on a hot plate and subject to moderate heating at approximately 100–150° C. while the implanted sample 1203 is pressed against the semiconductor substrate 1204 with a relatively light force, such as that exerted with a cotton-tipped applicator. After heating the samples in this manner for a moderately long time of approximately 15–30 minutes, the implanted surface 1201 of the implanted sample 1203 will adhere to the flat polished surface 1205 of the semiconductor substrate 1204 such tht the sample 1203 is effectively bonded to the semiconductor substrate 1204.

It is believed that the adhesion of the implanted sample 1203 to the semiconductor substrate 1204 is the result of the generation of pyroelectric charge in the LiNbO$_3$ which results in electrostatic attraction to the flat polished bonding surface 1205 of the semiconductor substrate 1204, which is covered by a thin insulated layer of native oxide (not shown). The strength of the adhesion is not important so long as the implanted sample 1203 is firmly held by the semiconductor substrate 1204 while subsequent snap-off detachment of the wave retarder plate is carried out.

Once the implanted LiNbO$_3$ sample 1203 is bonded to the semiconductor substrate 1204 in the manner described above, both the ion-implanted sample 1203 and the semiconductor substrate 1204 are placed in a furnace and subjected to a rapid temperature increase in an ambient of forming gas of 95% nitrogen and 5% hydrogen. The composition of the ambient during the rapid temperature increase is not critical, since an ambient of 100% nitrogen will work just as well. Exposing the ion-implanted LiNbO$_3$ sample 1203 to an abrupt temperature change from room temperature to several hundred degrees centigrade in a few seconds results in complete detachment of the wave retarder plate 1206 of single-crystal LiNbO$_3$ from the remaining LiNbO$_3$ sample 1207 at the ion-implanted damage layer by the process called "thermally induced snap-off." Upon cooling the detached wave retarder plate 1206 remains bonded to the semiconductor substrate 1204, from which it may be released by immersion of the substrate and bonded wave retarder plate in methanol or distilled water.

It is believed that the thermally-induced snap-off caused by rapid temperature increase is the result of pressure build-up of helium ions in the damage layer 1202 formed by ion implantation, which upon rapid heating produces a helium ion "explostion" within the damage layer 1202 so as to separate the thin wave retarder plate on one side of the damage layer 1202 from the remaining bulk crystal sample 1206 on the other side of the damage layer 1202. After the rapid temperature increase, the remaining LiNbO$_3$ bulk crystal sample 1207 is typically found a certain distance away from the separated wave retarder plate 1206.

Good uniform adhesion between the implanted surface 1201 of the implanted sample 1203 and the bonding surface 1205 of the semiconductor substrate 1204 is important to provide uniform lateral stress relief in the separated wave retarder plate 1206 so as to prevent breakage of the wave retarder plate 1206 that might otherwise occur.

The duration and maximum temperature of the rapid temperature anneal for detaching the wave retarder plate from the ion-implanted sample in the case of an X-cut LiNbO$_3$ sample implanted with He$^+$ at an energy of approximately 3.8 MeV and a dose of approximately 2.25×10$^{16}$ cm$^{-2}$ is approximately 2 to 10 seconds at a maximum temperature in the range of 500° C. to 600° C.

As mentioned above, the substrate to which the ion implanted sample is bonded may be of the same or similar material as the sample. For example, where the ion implanted sample is a LiNbO$_3$, the substrate may also be a LiNbO$_3$ crystal, or if the ion implanted sample is LiTaO$_3$, the substrate may be a LiTO$_3$ crystal. In each of these examples, the ion implanted sample and the substrate have substantially matching coefficients of thermal expansion. As in the exemplary embodiment illustrated in FIGS. 10A and 10B, the substrate may be of a different material from the ion implanted sample. Advantageously, the different material substrate has a similar crystallographic structure to the ion implanted sample and is also pyroelectric, such as LiNbO$_3$ or LiTaO$_3$, or the substrate may be of a material that provides for pyroelectric bonding, such as doped silicon. In the case of doped silicon, the implanted sample is electrostatically bonded to the silicon through a thin native silicon dioxide layer coating the surface of the silicon substrate.

Using the technique described above with reference to FIGS. 10A and 10B, wave retarder plates as large as 5×5 mm$^2$ have been fabricated. The optical properties of these films are slightly altered from that of bulk LiNbO$_3$ crystal. However, the optical properties may be restored to that of the bulk crystal by annealing the films for a sufficiently long time, such as 6 hours, at a temperature of 400° C. or greater in an atmosphere comprising oxygen.

Figure 11:
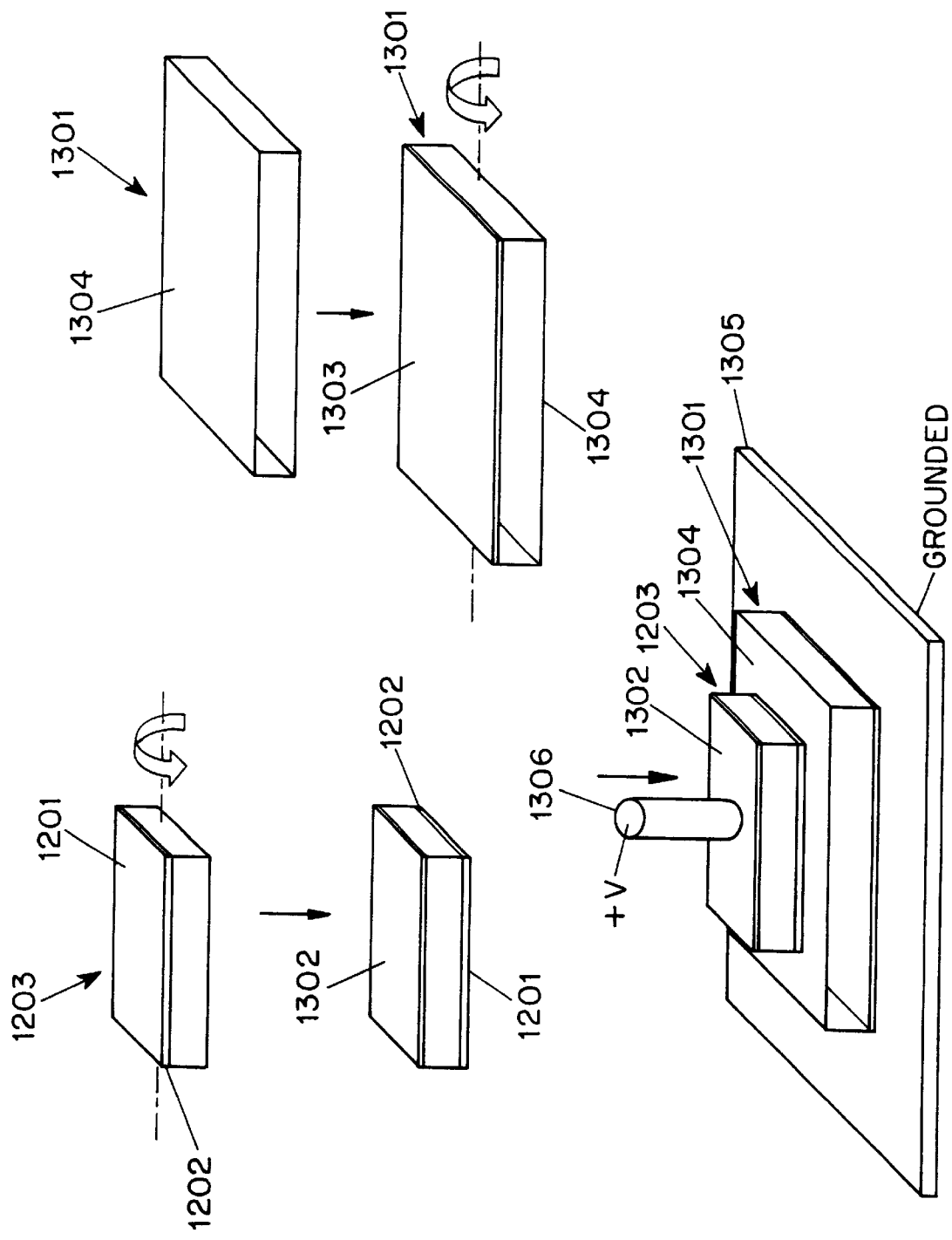
FIG. 11 shows isometric views illustrating another exemplary implementation of the method of FIG. 9, wherein the planar major surface of the ion implanted bulk birefringent metal oxide crystal is bonded directly to a first surface of a substrate by anodic bonding before the bulk crystal having the damage layer is subjected to a rapid temperature increase to effect detachment of the wave retarder plate from the bulk crystal, the detached wave retarder plate remaining bonded to the substrate.

Referring to FIG. 11, there are shown in isometric views an alternative technique for bonding an ion implanted sample 1203 to a substrate 1301 prior to subjecting the sample 1203 to a rapid temperature increase to effect thermally induced snap-off detachment of a wave retarder plate. The substrate 1301 used in this technique, which is referred to as anodic bonding, is a mobile-ion-rich glass plate, such as a borosilicate glass (e.g., Pyrex) plate 1301 having an optically flat bonding surface 1304. An electrode layer 1302 is formed on the back side of the ion implanted sample 1203, i.e., the side opposite that of the ion implanted surface 1201 by deposition of a layer of a suitable metal such as aluminum. Likewise, an electrode layer 1303 is formed on the backside of the substrate 1301, i.e., the side opposite that of the optically flat bonding surface 1304, by deposition of a layer of a suitable metal such as aluminum. Both the ion implanted sample 1203 and the substrate 1301 are then ultrasonically cleaned in acetone, methanol and distilled water, and the ion implanted surface 1201 of the sample 1203 is placed in contact with the optically flat bonding surface 1304 of the substrate 1301. The backside of the substrate 1301 having the electrode layer 1303 is brought into contact with a grounded metal plate 1305, while a metal electrode 1306 is brought into contact with the electrode layer 1302 on the backside of the ion implanted sample 1203. A high voltage in the range of 1–2 kV is applied to the electrode 1306 while a force is exerted against the backside of the ion implanted sample 1203 through the electrode 1306 to hold the ion implanted surface 1201 of the ion implanted sample 1203 tightly against the optically flat bonding surface 1304 of the substrate 1301 for a period of approximately 30 sec to cause bonding of the ion implanted sample 1203 to the substrate 1301.

It is believed that the application of the high voltage to the electrode 1306 causes migration and drift of oxygen, boron and sodium ions within the borosilicate glass plate 1301, and the oxygen ions are responsible for the bonding by serving as a "connection" between the ion implanted surface 1201 of the sample 1203 and the bonding surface 1304 of the borosilicate glass substrate 1301. It is noted that for such bonding to occur, the ion implanted surface 1201 of the implanted sample 1203 must have an affinity for oxygen, which is normally the case with ferroelectric/metal oxide materials such as LiNbO$_3$. In addition, the ion implanted sample must have a non-zero (i.e., non-vanishingly small) electrical conductivity.

Once the ion implanted sample 1203 is bonded to the borosilicate glass substrate 1301, the sample 1203 and the substrate 1301 are subjected to a rapid temperature increase in the manner described above with reference to FIG. 10B to effect thermally induced snap-off detachment of the wave retarder plate from the bulk crystal of the ion implanted sample 1203 so as to leave the detached wave retarder plate bonded to the borosilicate glass substrate 1301.

If the voltage applied to the electrode 1306 is less than 2 kV over a time period of approximately 30 seconds and the bonding temperature is less than 200°, the bonding of the ion implanted sample 1203 to the borosilicate glass substrate 1301 will generally have sufficient adhesion strength to hold the wave retarder plate during the thermally induced snap-off process, and the detached wave retarder plate may subsequently be released from the substrate 1301 by immersion of the substrate with the bonded wave retarder plate in methanol or water. However, if the voltage applied to the electrode 1306 is greater than 2 kV, the bonding of the detached wave retarder plate to the glass substrate 1301 will be permanent, in which event the detached wave retarder plate may be separated from the glass substrate 1301 by selectively etching away the glass substrate 1301 using an appropriate etchant such as a solution of hydrofluoric acid and water. To protect the detached wave retarder plate during such etching removal of the glass substrate 1301, the wave retarder plate may be encapsulated with an etchant-proof material such as black wax.

Figure 12:
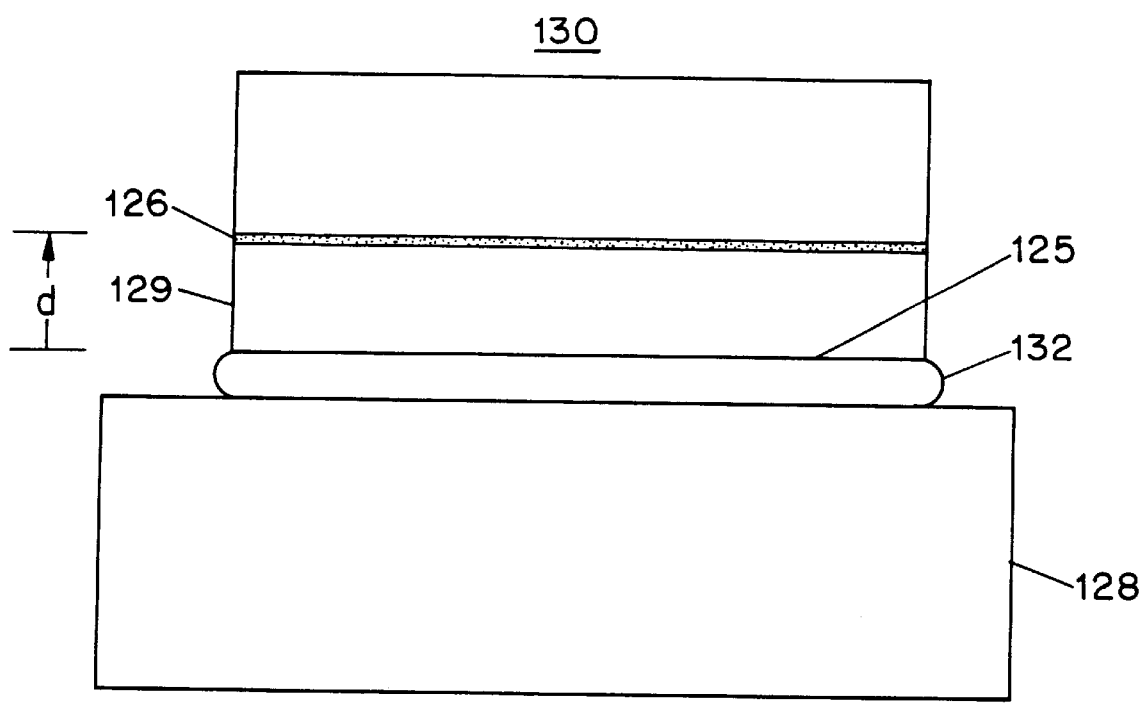
FIG. 12 is a side view of an ion implanted bulk birefringent metal oxide crystal having an ion-implanted damage layer where the planar major surface of the bulk crystal is bonded indirectly to a first surface of a substrate via a high melting temperature bonding layer.

Turning now to FIG. 12, there is shown in side view an ion-implanted bulk birefringent metal oxide crystal sample 130 having a damage layer 126 where the implanted planar major surface 125 is bonded to a substrate 128 using a layer of suitable high melting temperature cement 132. The bulk ion-implanted crystal sample 130 is X-cut LiNbO$_3$ crystal implanted with He$^+$ ions at an appropriate energy such that the planar major surface 125 and the damage layer 126 define the wave retarder plate 129 to be detached from the ion-implanted bulk crystal sample 130. The thickness of the wave retarder plate d is determined from equation (2) or from Table I. Once the ion-implanted bulk X-cut LiNbO$_3$ crystal sample 130 is bonded to the substrate 128, the substrate 128 and the sample 130 are placed in a furnace and subjected to a rapid temperature increase to effect thermally induced snap-off detachment of the wave retarder plate 129 in the same manner as described above with reference to FIG. 10B. The melting temperature of the cement used to bond the implanted sample 130 to the substrate 128 must be higher than the highest temperature used during the rapid temperature increase to cause detachment of the wave retarder plate 129. The substrate 128 having the detached wave retarder plate 129 bonded thereto may then be immersed in a suitable solvent that dissolves the bonding layer 132 to effect release of the wave retarder plate 129.

The released wave retarder plates fabricated in the manner described with reference to FIGS. 10B, 11 and 12 may be placed on a substrate that is of the same material type, such as a LiNbO$_3$ wave retarder plate on a LiNbO$_3$ substrate, or any other substrate that has a coefficient of thermal expansion comparable to that of the wave retarder plate, and annealed for a period of approximately 10 hours at a temperature in the range of 400–800° C. (depending on the material of the wave retarder plate) in an atmosphere comprising oxygen gas. Typical ramp times used for heating and cooling are 5–10° C. per minutes. This annealing step helps to remove the residual mechanical stress in the detached wave retarder plate, repair the residual damage caused by ion implantation and replenish possible deficiencies of the oxygen in the wave retarder plate, as well as to reduce the roughness of the underside surface of the detached single-crystal wave retarder plate.

For some materials the temperatures used in the rapid temperature increase for thermally induced snap-off of the wave retarder plate and the subsequent annealing after detachment may exceed the Curie temperature at which phase transition in the single-crystal material normally occurs. This in turn may cause a change in spontaneous polarization in certain materials so that an initially single-polarization-domain crystal may have a multi-domain structure (i.e., adjacent domains may have opposite directions of spontaneous polarization). Although for some applications of such materials this is highly undesirable, for applications of wave retarder plates such reversal of the direction of spontaneous polarization will have no effect since the linear optical properties of the wave retarder plates are essentially those of the bulk single-crystals from which the wave retarder plates are detached.

Figure 13:
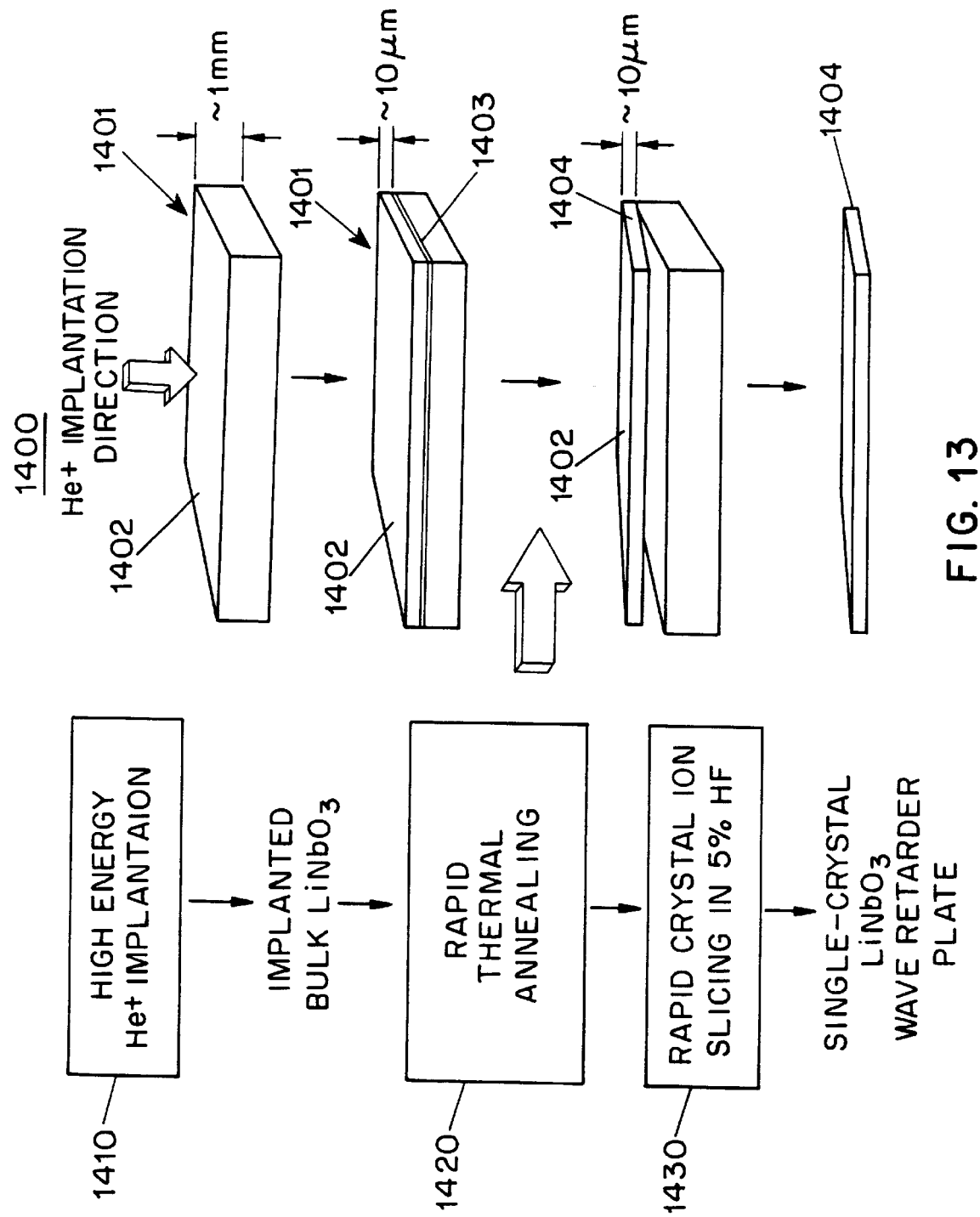
FIG. 13 shows a flow diagram and isometric views illustrating the detachment of a wave retarder plate from a bulk $LiNbO_3$ crystal according to the method of FIG. 7 where the ion implanted bulk crystal having the damage layer is subjected to rapid thermal annealing prior to chemical etching in order to enhance the etching rate of the damage layer to effect detachment of the wave retarder plate from the bulk $LiNbO_3$ crystal.

Turning now to FIG. 13 there are shown a flow diagram representing the method of FIG. 7 applied to forming a LiNbO$_3$ wave retarder plate by He$^+$ ion implantation of a bulk LiNbO$_3$ crystal and the detachment of the LiNbO$_3$ wave retarder plate by selective chemical etching, where the efficiency of the etching is enhanced by a rapid thermal annealing step. Also shown in FIG. 12 are isometric views of the bulk LiNbO$_3$ crystal and the detachment of a single-crystal LiNbO$_3$ wave retarder plate therefrom. In the illustrative example, the bulk crystal is a 1 mm thick slab of LiNbO$_3$ single crystal. As shown in FIG. 13, the exemplary method includes the steps of implanting He$^+$ ions into the LiNbO$_3$ bulk crystal 1401 in a direction normal to a planar major surface 1402 thereof so as to form a damage layer 1403 within the bulk crystal (step 1410). The implanted bulk crystal 1401 having the damage layer 1403 is then subject to rapid thermal annealing (step 1420). Thereafter, the ion implanted bulk LiNbO$_3$ crystal 1401 having the damage layer 1403 is etched in 5% hydrofluoric acid to preferentially remove the damage layer and thereby detach a single-crystal LiNbO$_3$ wave retarder plate 1404. By performing the rapid thermal annealing (step 1420) prior to chemical etching (step 1430), the time required for detaching the single-crystal wave retarder plate may be reduced by as much as a factor of 100. Using the exemplary method depicted in FIG. 13, single-crystal LiNbO$_3$ wave retarder plates as large as 0.5×1 cm$^2$ of excellent quality may be detached from an ion implanted bulk LiNbO$_3$ crystal in a just a matter of a few hours. The detached single-crystal LiNbO$_3$ wave retarder plate 1404 may be placed on a LiNbO$_3$ substrate (not shown), or a substrate of a different material having a comparable thermal expansion coefficient, and annealed for approximately 10 hours at a temperature of 400–800° C. in an atmosphere of flowing argon and oxygen gases with ramp rates for heating and cooling of approximately 5–10° C. per minute to remove residual mechanical stress and residual ion implantation damage, as well as to reduce the roughness of the underside surface of the detached single-crystal wave retarder plate. Advantageously, the rapid thermal annealing prior to chemical etching is carried out at a temperature of 300 to 700° C. for approximately 45 seconds in an atmosphere of 5% hydrogen and 95% nitrogen forming gas.

Figure 14A:
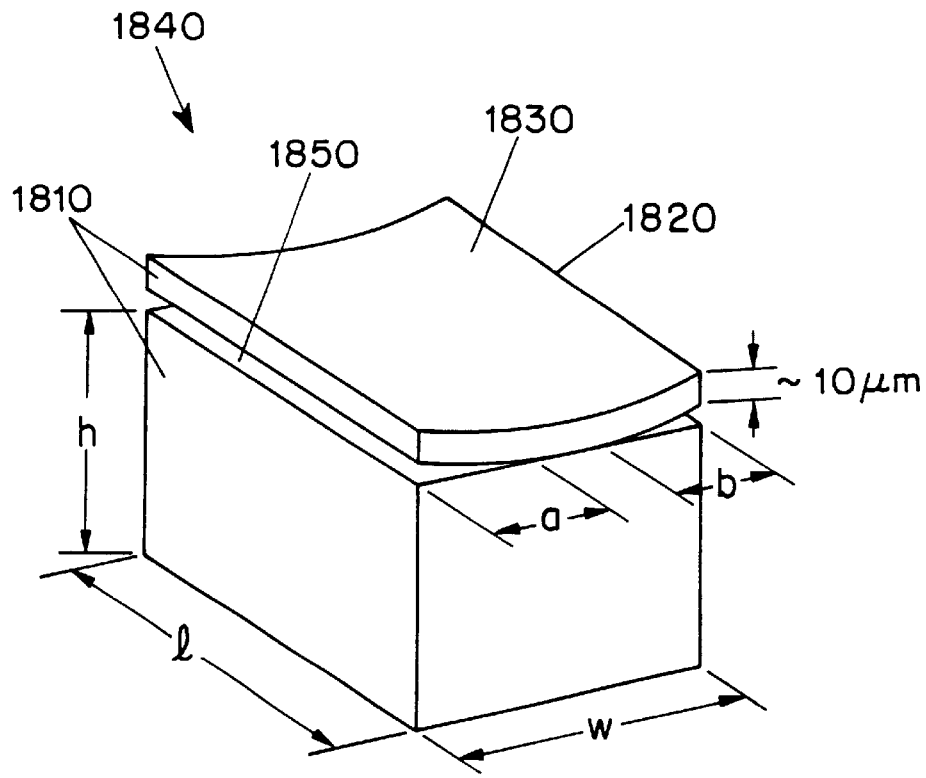
FIGS. 14A and 14B are isometric and top views, respectively, illustrating undercutting of the damage layer by etching of an ion implanted bulk birefringent metal oxide crystal in accordance with the methods of FIGS. 3 and 7.
Figure 14B:
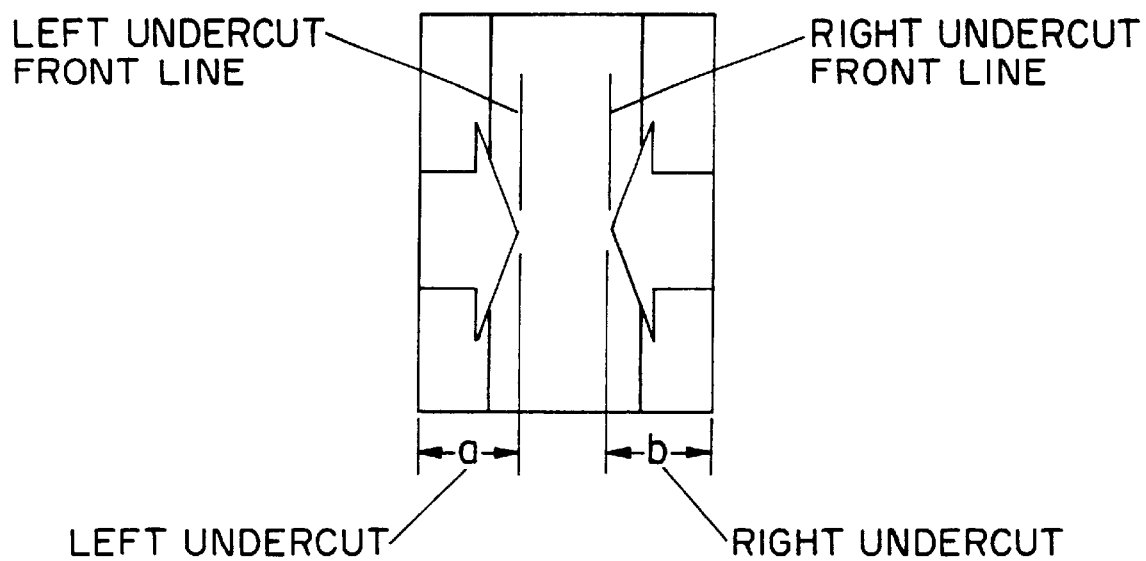

Turning now to FIGS. 14A to 14B, there are shown isometric and top views, respectively, of a bulk crystal illustrating how the chemical etching step (step 24 in FIG. 3 and step 96 in FIG. 7) causes a single-crystal wave retarder plate to be detached from the bulk crystal. As shown in FIG. 14A, left and right undercut regions a and b, respectively, form along the width w of the bulk crystal 1840 from the left and right facets 1810 and 1820, respectively, in the damage layer 1850 of the bulk crystal 1840. The undercut regions a and b uniformly progress towards the center of the bulk crystal 1840 until the single-crystal wave retarder plate 1830 becomes detached from the bulk crystal 1840. FIG. 15B shows the undercut lengths a and b as determined using Nomarski prism optical microscopy to measure the extent of the interference pattern created by the air gap between the partially detached wave retarder plate and the bulk crystal.

Figure 15A:
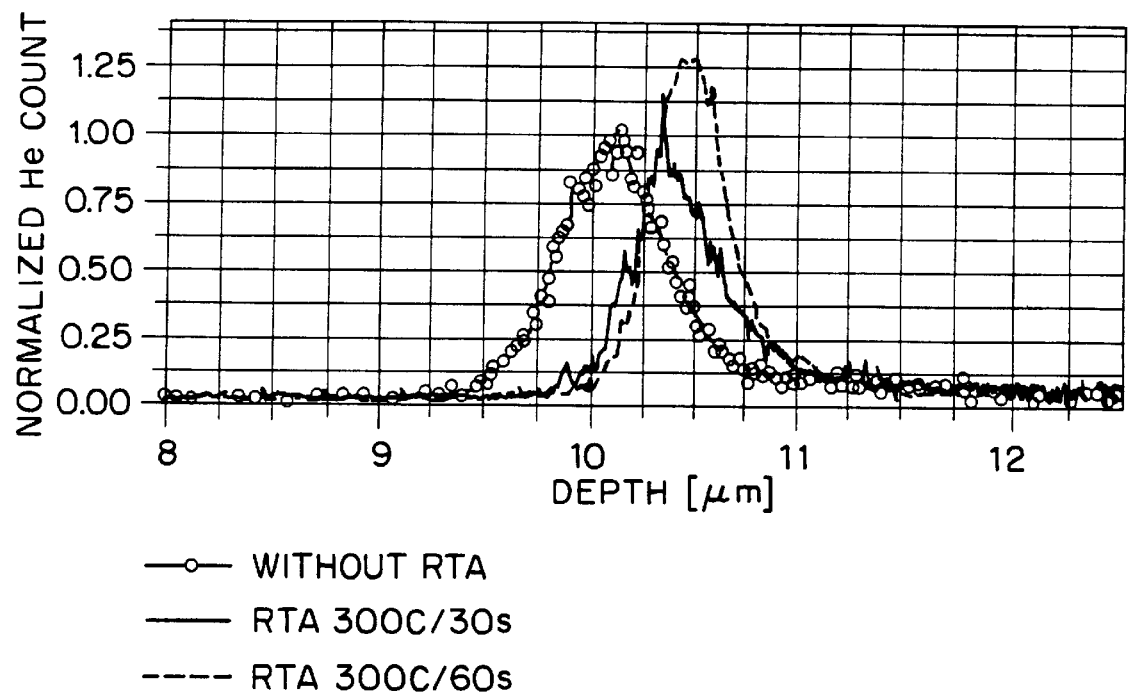
FIGS. 15A and 15B show graphically the $He^+$ and Li area-normalized SIMS data, respectively, with and without rapid thermal annealing in a 3.8 MeV $He^+$ implanted $LiNbO_3$ bulk crystal.
Figure 15B:
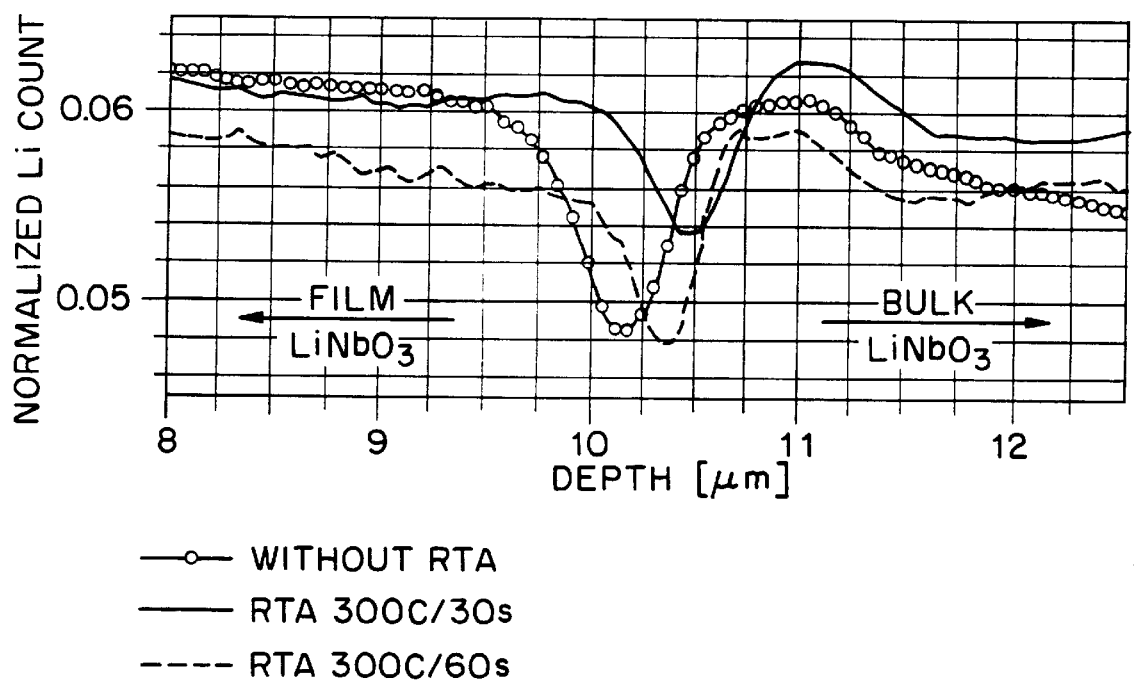

Referring to FIGS. 15A and 15B there are shown He$^+$ and Li area-normalized spectra, respectively, obtained by secondary ion mass spectroscopy (SIMS) on ion implanted single-crystal LiNbO$_3$. The He$^+$ and Li area-normalized SIMS spectra are shown for a 3.8 MeV He$^+$ implanted LiNbO$_3$ crystal before and after the rapid thermal annealing step. No He$^+$ loss is assumed during the rapid thermal annealing step, and the offset in Li spectra is a measurement artifact.

As shown in FIGS. 15A and 15B, rapid thermal annealing causes a change in the He$^+$ and Li SIMS spectra in the implanted samples. The figures show that the post-anneal He$^+$ distribution becomes sharper and narrower, which results in an increase in the internal pressure in the damage layer. Due to its low solid solubility, He$^+$ tends to fill in implantation-generated micro-voids. The high Li mobility allows it to be displaced from lattice sites and replaced by the He$^+$ ions. The peaks in the He spectra are thus shifted deeper into the bulk crystal with increasing annealing exposure, while depletion dips in the Li spectra follows the same trend. This thermal migration or spatial displacement of internal voids and pressure buildup in the damage layer result in enhanced etch rates when the bulk crystal is annealed prior to etching.

Figure 16A:
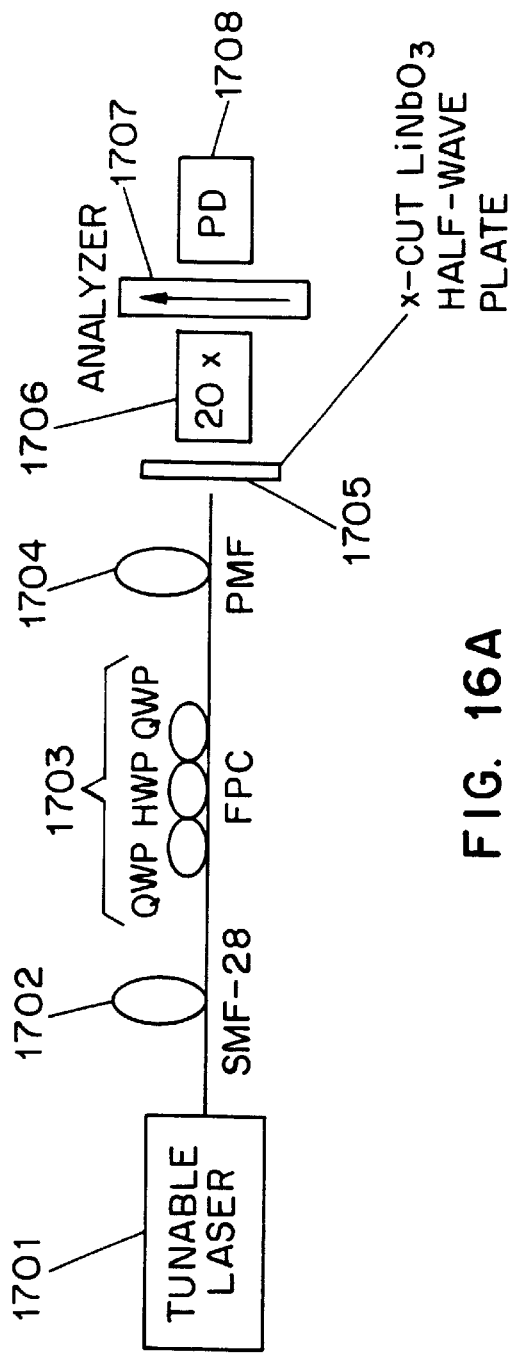
FIGS. 16A and 16B are schematic diagrams of apparatus used to measure the properties of wave retarder plates.
Figure 16B:
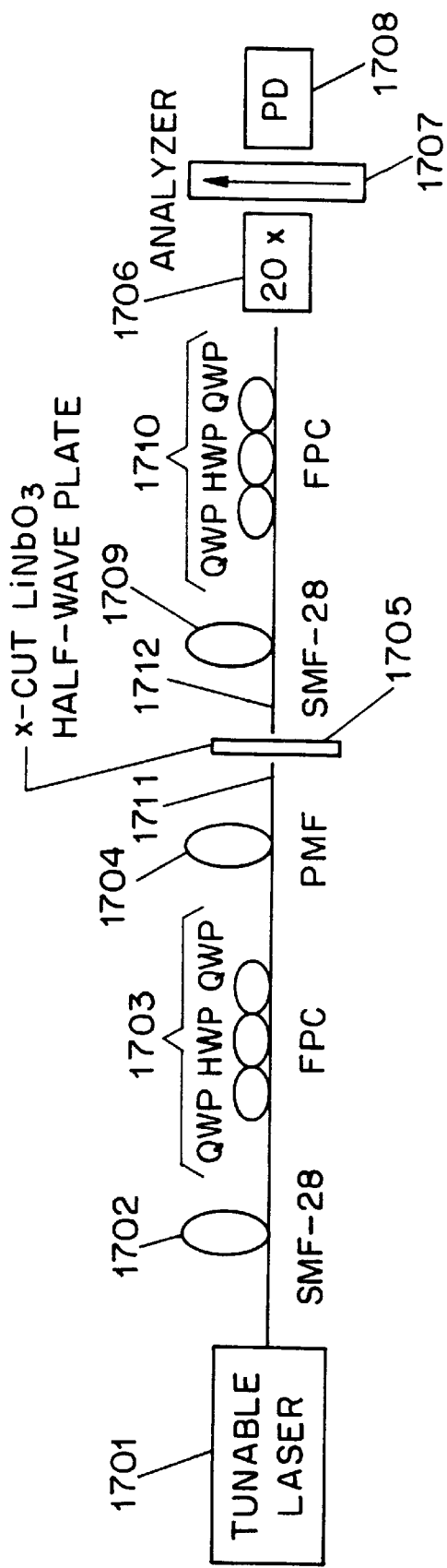

Turning to FIGS. 16A and 16B, there are shown schematic diagrams of apparatus used to characterize X-cut LiNbO$_3$ half-wave plates fabricated in accordance with the method of the present invention. In both the apparatus of FIGS. 16A and 16B, a tunable continuous wave laser 1701 is used as the light source. The output of the tunable laser is fed into a standard SMF-28 single-mode fiber 1702, followed by a conventional 30 dB extinction ratio fiber polarization controller (FPC) 1703 and a conventional polarization maintaining fiber (PMF) 1704. In the apparatus of FIG. 16A, the light is end-fire coupled into the half-wave plate 1705 and collected at the other side of the half-wave plate 1705 with a 20×objective lens 1706 followed by a near infrared polarization analyzer 1707 having a 30 dB extinction ratio and a photodetector (PD) 1708. The half-wave plate 1705 is mounted on a rotating mount (not shown) allowing for control of the angle (θ) between its optic axis and the direction of the plane polarized input field. In the apparatus of FIG. 16B, the light exiting the PMF fiber 1704 is end-fire coupled into another SMF-28 section 1709 through the half-wave plate 1705 positioned in a gap between the fibers 1711 and 1712. The second SMF-28 section 1709 is followed by a second FPC device 1710 and the same objective-analyzer-photodetector 1706, 1707, 1708 used in the apparatus of FIG. 16A.

Figure 17:
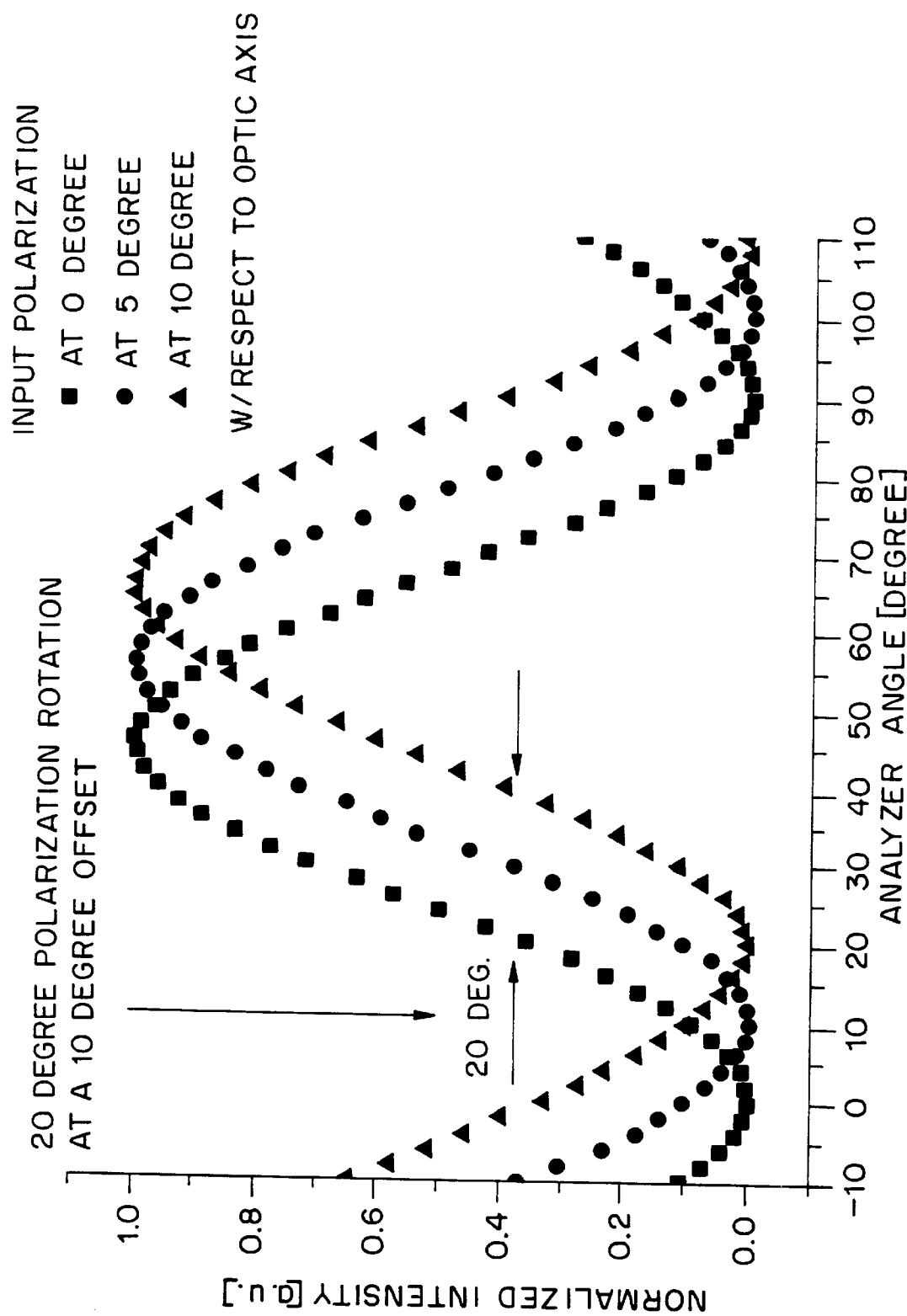
FIG. 17 shows plots of the output intensity of 1.55 $\mu$m plane polarized light passing through and X-cut $LiNbO_3$ half-wave plate, fabricated in accordance with the present invention, and a near infrared analyzer versus the angle of the analyzer for three different orientations of the optic axis of the half-wave plate with respect to the polarization of light incident on the half-wave plate, as measured using the apparatus of FIG. 16A.

Referring to FIG. 17, there are shown graphs of the normalized intensity of light having a wavelength of 1550 nm as detected by the photodetector 1708 of the apparatus of FIG. 16A plotted against the angle of the NIR analyzer 1707 of the apparatus for three different angles of the optic axis of a zeroth-order X-cut LiNbO$_3$ half-wave plate 1705 fabricated in accordance with the present invention with respect to the polarization of the light incident on the half-wave plate 1705. As shown in FIG. 17, when the half-wave plate is rotated by an angle Δθ, the polarization of output light from the half-wave plate 1705 is rotated by 2 Δθ.

Figure 18:
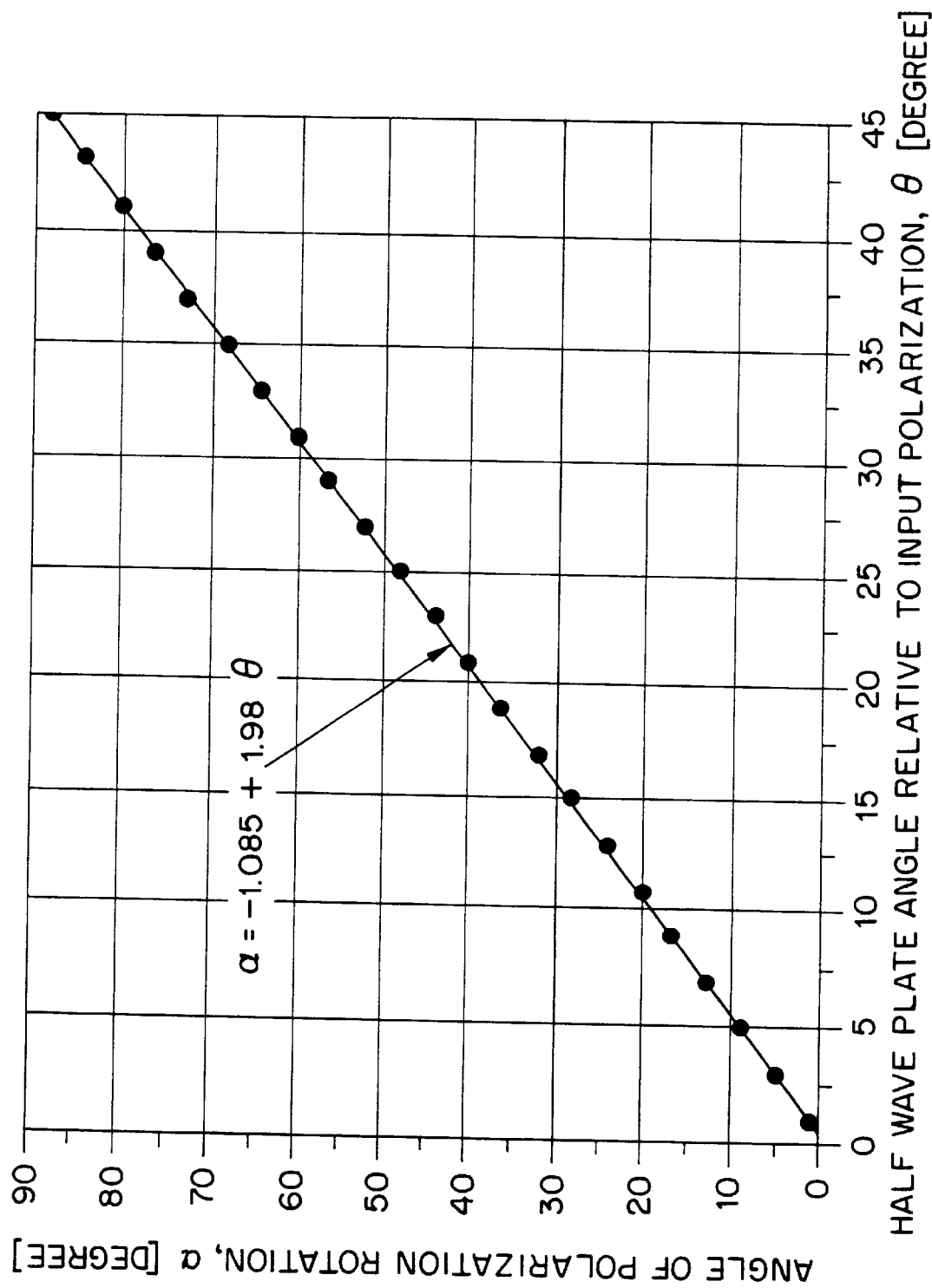
FIG. 18 is a plot of the angle of polarization rotation of plane polarized 1.55 μm light passing through an X-cut LiNbO₃ half-wave plate fabricated in accordance with the present invention versus the angle between the optic axis of the half-wave plate and the polarization of light incident on the half-wave plate, as measured with the apparatus of FIG. 16A.

Turning to FIG. 18, there is shown a graph of the angle of polarization rotation, as measured using the apparatus of FIG. 16A, for plane polarized light passing through a zeroth-order X-cut LiNbO$_3$ half-wave plate 1705 fabricated according to the present invention plotted against the angle of the optic axis of the half wave plate 1705 with respect to the polarization of light incident on the half-wave plate 1705. As shown in the graph of FIG. 18, the rotation of polarization of plane polarized light in passing through the half-wave plate is linearly dependent on the angle between the optic axis of the half-wave plate and the polarization of the light incident on the half-wave plate with a measured slope of 1.98±±0.02.

Figure 19:
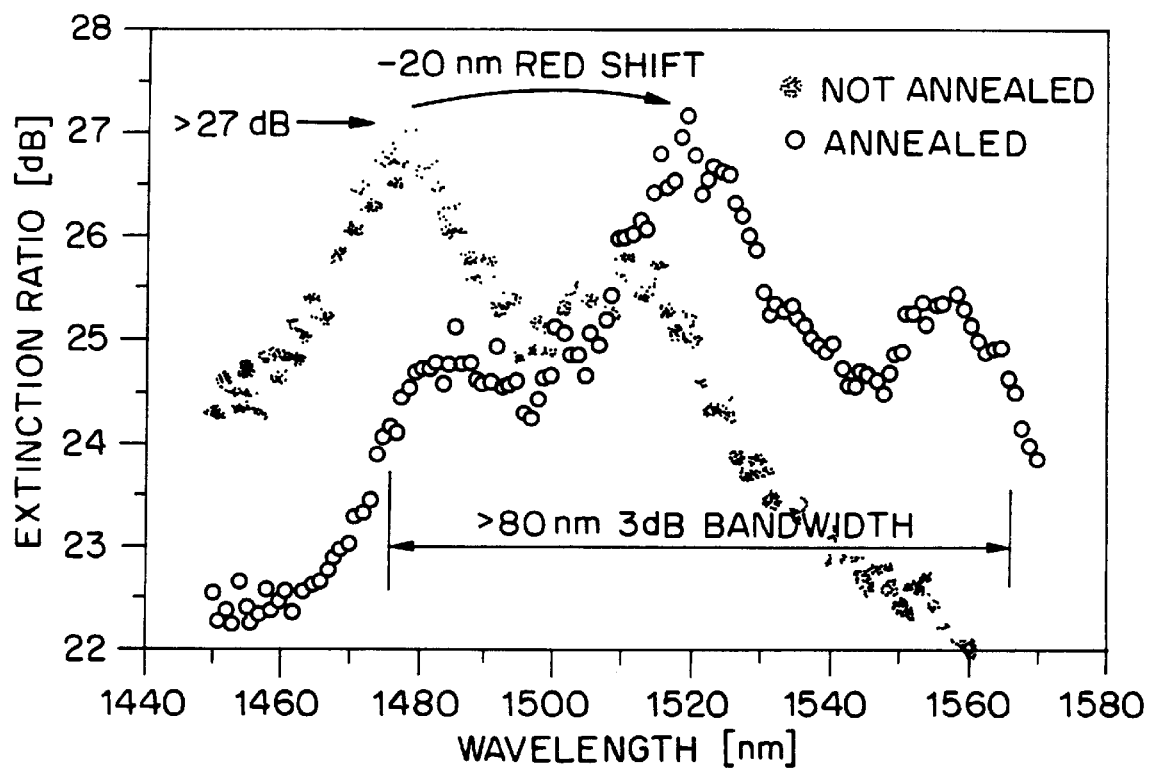
FIG. 19 shows plots of the extinction ratio of plane polarized light after passing through an X-cut LiNbO₃ half-wave plate fabricated in accordance with the present invention versus the wavelength of the light, as measured using the apparatus of FIG. 16B, for the half-wave plate before and after post-liftoff annealing.

Referring to FIG. 19, there are shown graphs of the extinction ratio plotted against wavelength for a zeroth-order X-cut LiNbO$_3$ half-wave plate made in accordance with the method of the present invention before and after post-liftoff annealing, as measured with the apparatus of FIG. 16B. The measurements are made by first calibrating and aligning the apparatus with out the half-wave plate 1705 to transmit plane polarized light with an extinction ratio of approximately 30 dB over a 1450–1570 nm wavelength range. The half-wave plate is then inserted in the gap between fibers 1711 and 1712 with its optic axis at 45° with respect to the polarization of incident light, and the extinction ratios between the two orthogonal plane polarization states are plotted as a function of wavelength. It is noted that a post-detachment anneal at approximately 400° C. for approximately 5 hours in an atmosphere comprising oxygen gas caused an approximately 20 nm shift towards longer wavelengths in the peak extinction ratio, which is measured to be in excess of 27 dB for both cases. The measured peak extinction ratio at 1520 nm corresponds to a calculated half-wave plate thickness of 10.35 μm. In both cases, a broad 3 dB bandwidth is obtained. In certain cases an instrumentation-limited value of 30 dB was recorded for the extinction ratio of a zeroth-order X-cut LiNbO$_3$ half-wave plate fabricated in accordance with the method of the present invention.

Figure 20:
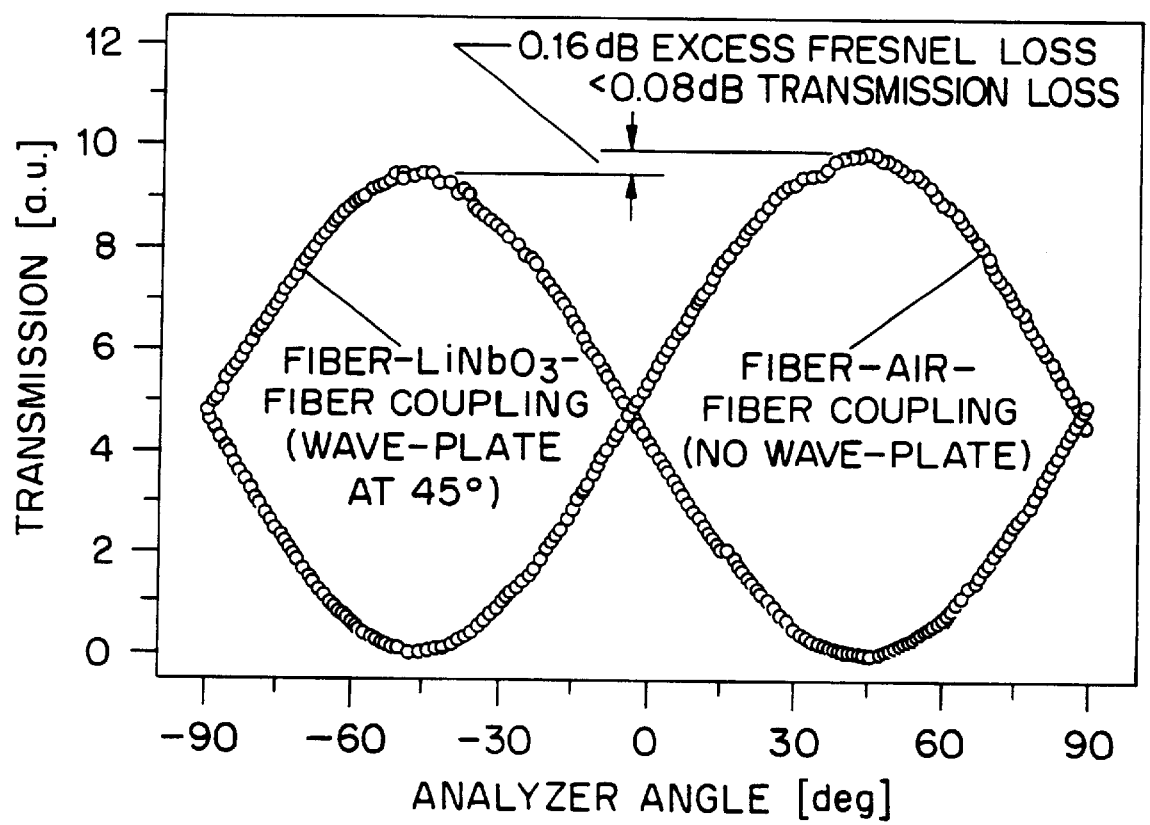
FIG. 20 shows plots of tranmission of 1.55 μm plane polarized light versus analyzer angle measured using the apparatus of FIG. 16B for the case of air in the fiber gap and for the case of an X-cut LiNbO₃ half-wave plate fabricated in accordance with the present invention in the fiber gap with the optic axis of the half-wave plate at 45° with respect to the polarization of light incident on the half-wave plate.

Turning now to FIG. 20, there is shown a plot of the transmission measured by the photodiode 1708 versus the angle of the analyzer 1707, as measured with the apparatus of FIG. 16B for the apparatus having no half-wave plate and for the apparatus having a zeroth-order X-cut LiNbO$_3$ half-wave plate 1705 designed for a wavelength of 1.55 μm made in accordance with the method of the present invention with its optic axis oriented at 45° with respect to the polarization of light incident on the half-wave plate. It is noted that the insertion of the zeroth-order half-wave plate 1705 resulted in a full 90° rotation of the input polarization field with an excess transmission loss of less than 0.1 db.

Figure 21:
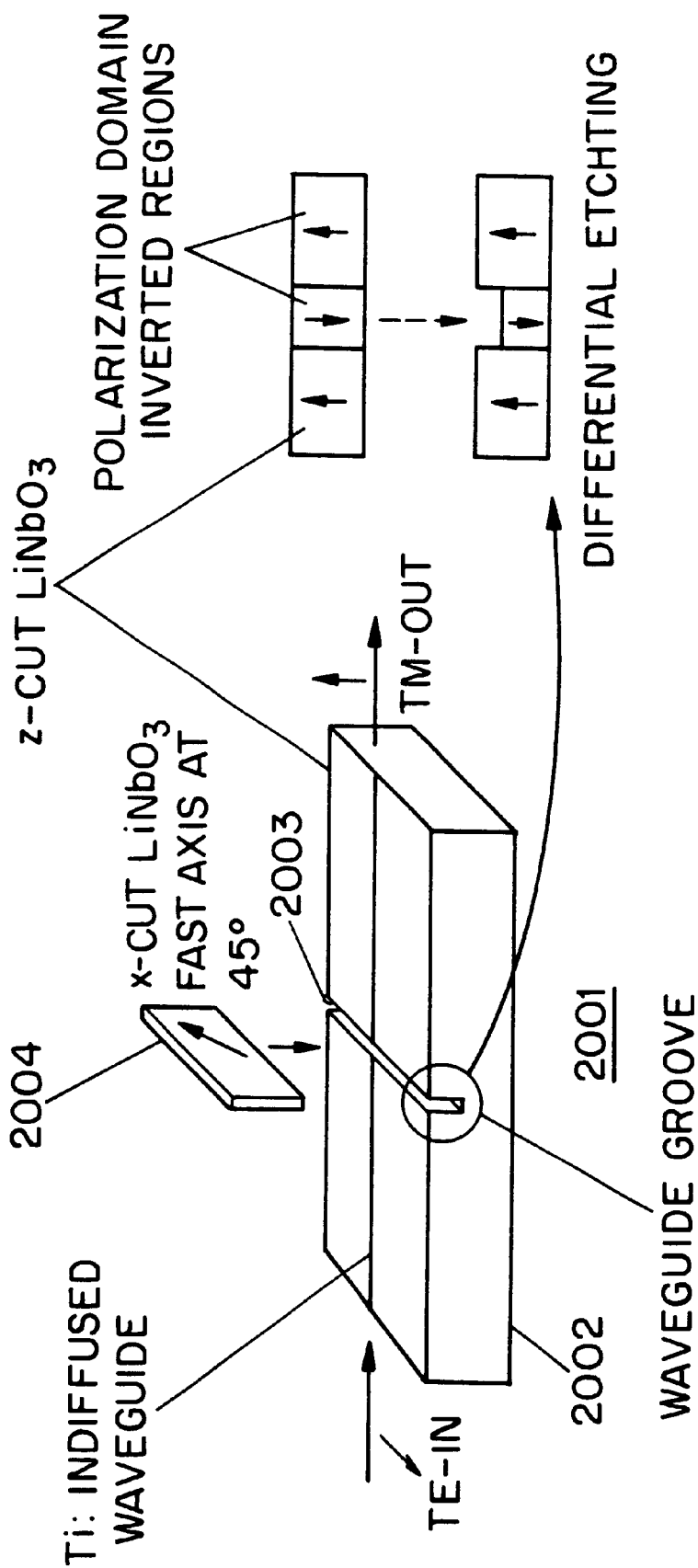
FIG. 21 is an exploded view of a TE-TM waveguide polarization mode converter consisting of a section of Ti: indiffused Z-cut LiNbO₃ waveguide having a groove perpendicular to the direction of light propagation in the waveguide section, and an X-cut LiNbO₃ half-wave plate fabricated in accordance with the present invention inserted in the groove with the optic axis of the half-wave plate at 45° with respect to the electric field vector of the TE and the TM light wave modes propagating in the waveguide section, and diagrams illustrating a method for inverting the domain polarization in a selected region of the LiNbO₃ waveguide section for forming the groove by differential etching.

Turning now to FIG. 21, there are shown an exploded view of an optical waveguide polarization mode converter 2001 that uses a zeroth-order half-wave plate 2004 fabricated in accordance with the method of the present invention and a diagram illustrating the formation of a narrow groove 2003 in a Z-cut LiNbO$_3$ titanium indiffused waveguide 2002 by spatially selective domain inversion and deferential etching. The polarization mode converter has a section of titanium indiffused waveguide 2002 formed in a slab of Z-cut LiNbO$_3$ single crystal, the waveguide section supporting both TE and TM modes of propagation. A groove 2003 having a width slightly larger than the thickness of an X-cut zeroth-order LiNbO$_3$ half-wave plate and a depth of approximately 100 μm is formed in the waveguide section perpendicular to the direction of wave propagation therein. The groove 2003 is advantageously formed by inverting the domain polarization in the region where the groove is to be formed so as to cause the domain inverted region to have a higher etching rate than the non-inverted regions. The waveguide is then etched in a solution of hydrofluoric acid and nitric acid to form the groove. A technique for fabricating ridge structures in Z-cut LiNbO$_3$ by differential etching after spatially selective domain inversion is described in I. E. Barry et al., "Ridge Waveguides in Lithium Niobate Fabricated by Differential Etching following Spatially Selective Domain Inversion," Appl. Phys. Letts., Vol. 74, No. 10, pp. 1487–1488, Mar. 8, 1999. A zeroth-order X-cut LiNbO$_3$ half-wave plate 2004 fabricated in accordance with the present invention is inserted in the groove with its optic axis at 45° with respect to the electric field vector of the TE and TM modes of propagation in the waveguide section 2002. Accordingly, a TE mode guided optical wave propagating in the waveguide section 2002 passing through the half-wave plate 2004 will be converted to a TM mode guided optical wave. Likewise, a TM mode guided optical wave propagating in the waveguide section 2002 passing through the half-wave plate 2004 will be converted to a TE mode guided optical wave. It is noted that the waveguide section may be any type of optical waveguide, such as a silica-based waveguide, that supports both TE and TM modes of propagation. In addition, the groove in the waveguide section may be formed by means other than differential etching, such as cutting with an ultra-thin saw blade.

Figure 22A:
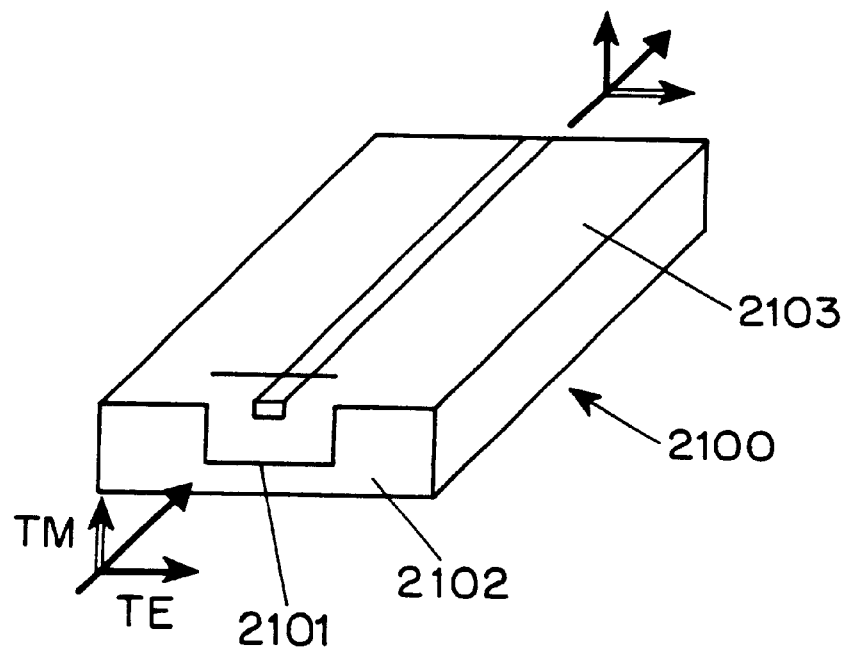
FIG. 22A is an isometric view of an alternative configuration for a TE-TM waveguide polarization mode converter consisting of a section of Ti: indiffused waveguide having an X-cut LiNbO₃ half-wave plate fabricated in accordance with the present invention bonded to the front end facet of the waveguide section, the optic axis of the half-wave plate being at 45° with respect to the electric field vector of the TE and the TM light wave modes propagating in the waveguide section.
Figure 22B:
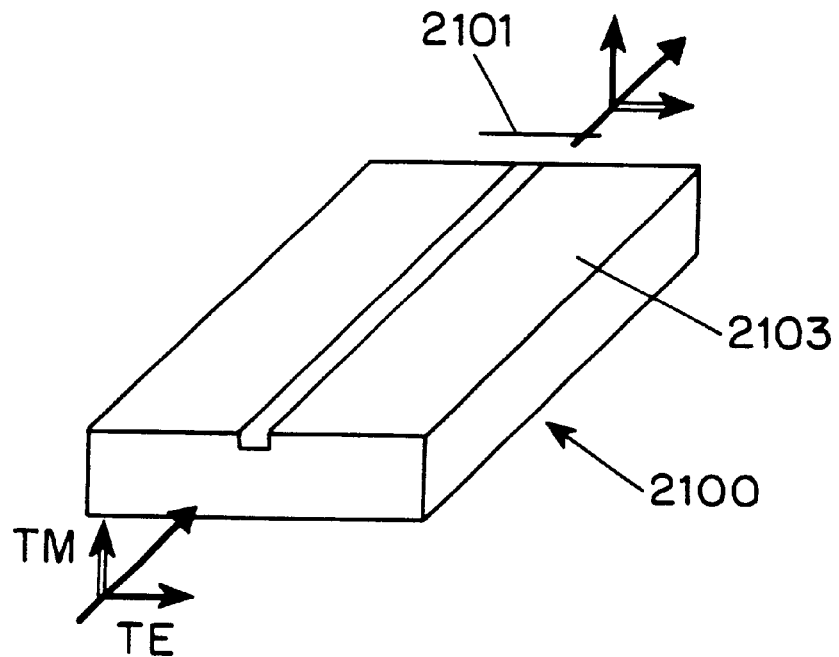
FIG. 22b is an isometric view of a further alternative configuration for a TE-TM waveguide polarization mode converter consisting of a section of Ti: indiffused Z-cut LiNbO3 waveguide having an X-cut LiNbO3 half-wave plate fabricated in accordance with the present invention bonded to the rear end facet of the waveguide section, the optic axis of the half-wave plate being at 45 with respect to the electric field vector of the TE and TM light wave modes propagating in the wave guide section.

Turning to FIGS. 22A and 22B, there are shown alternative exemplary embodiments of optical waveguide polarization mode converters using half-wave plates fabricated in accordance with the method of the present invention. As shown in FIG. 22A, a section of titanium indiffused optical waveguide section is formed in a slab of Z-cut $LiNbO_3$ single crystal with polished edges has a zeroth-order X-cut $LiNbO_3$ half-wave plate 2101 fabricated in accordance with the method of the present invention bonded to the front facet 2102 of the waveguide section 2100 where optical waves enter the waveguide section. The waveguide section 2100 supports TE or TM, or both modes of optical wave propagation. The half-wave plate 2100 may be bonded to the front facet 2102 of the waveguide section 2100 by Van der Waals bonding or by means of a suitable cement applied to portions of the half-wave plate 2101 outside of the optical field for example. The half-wave plate is bonded with its optic axis at 45° with respect to the direction of the electric field vector of the TE and/or TM modes of propagation in the waveguide section 2100. With the arrangement of FIG. 22A, a guided TE mode optical wave passing through the half-wave plate 2101 will propagate in the waveguide section 2100 as a TM mode optical wave. Likewise, a guided TM mode optical passing through the half-wave plate 2101 will propagate in the waveguide section 2100 as a TE mode optical wave.

The exemplary arrangement shown in FIG. 22B also has a titanium indiffused optical waveguide section 2100 formed in a slab of Z-cut LiNbO3 crystal having polished edges. The waveguide section 2100 supports TM or TE, or both modes of propagation. A zeroth-order X-cut LiNbO3 half-wave plate 2101 fabricated in accordance with the method of the present invention is attached to the rear-end facet of the optical waveguide section 2100 which are coupled to leave the waveguide section. Attachment of the half-wave plate 2101 to the rear-end facet of the waveguide section 2100 may be by Van der Walls bonding or by means of a suitable cement applied to portions of the half-wave plate 2101 outside of the optical field for example. The half-wave plate 2101 is oriented so that its optic axis is at 45 with respect to the direction of the electric field vector of TE and/or TM modes of propagation in the waveguide section 2100. With the exemplary arrangement of FIG. 22b, a TM mode optical wave propagating in the waveguide section 2100 passing through the half-wave plate 2101 is converted to a TE mode optical wave for further guided propagation, while a TE mode optical wave propagating in the waveguide section 2100 passing through the half-wave plate 2101 is converted to a TM mode optical wave for further guided propagation.

Although the present invention has been described in detail with reference to specific exemplary embodiments thereof various modifications, alterations and adaptations may be made by those skilled in the art without departing from the spirit and scope of the invention. It is intended that the invention be limited only by the appended claims.

What is claimed is:

1. A method for fabricating a wave retarder plate from a bulk birefringent metal oxide crystal having a planar major surface oriented with respect to principal crystallographic axes of the bulk crystal such that a plane wave normally incident on the planar major surface propagates in the bulk crystal in a first and a second normal mode having orthogonal polarizations and travelling at velocities of $c_0/n_a$ and $c_0/n_b$, respectively, where $c_0$ is the velocity of the plane wave in vacuum, and $n_a$ is the index of refraction along a first normal mode axis, $n_b$ is the index of refraction along a second normal mode axis and $n_b > n_a$, the method comprising:

(a) implanting ions into the bulk crystal through the planar surface in a direction perpendicular thereto to form a damage layer at an implantation depth d below the planar major surface of the bulk crystal, the planar major surface and the damage layer defining the wave retarder plate to be formed from the bulk crystal, the implantation depth d being given by the relation $$d = \frac{R\lambda}{[n_b(\lambda) - n_a(\lambda)]},$$

where R is the optical retardance of the wave retarder plate being formed and $\lambda$ is the wavelength of light for which the wave retarder plate is designed; and (b) chemically etching the damage layer to effect detachment of the wave retarder plate from the bulk crystal.

2. The method of claim 1, wherein the bulk crystal is one of $LiNbO_3$, $LiTaO_3$, $LiIO_3$, $\beta$-$BaB_2O_4$ and $LiB_3O_5$ crystals.

3. The method of claim 1, wherein R=0.25, and the wave retarder plate is a zeroth-order quarter-wave plate.

4. The method of claim 1, wherein R=0.5, and the wave retarder plate is a zeroth-order half-wave plate.

5. The method of claim 2, wherein the bulk crystal a $LiNbO_3$ crystal, and the chemically etching step comprises exposing the damage layer to hydrofluoric acid.

6. The method of claim 1, wherein the chemically etching step comprises:

immersing the bulk crystal having the damage layer in an etchant;

stirring the etchant; and maintaining the etchant at a constant etching temperature.

7. The method of claim 1, further comprising encapsulating the bulk crystal having the damage layer prior to the chemically etching step to minimize damage to the wave retarder plate during the chemically etching step.

8. The method of claim 1, wherein the implanting step comprises generating a beam of ions having a characteristic energy level which determines the implantation depth, d.

9. The method of claim 1, wherein the ions are elemental ions.

10. The method of claim 1, wherein the ions are chemically reactive ions.

11. The method of claim 1, further comprising rapid thermal annealing the bulk crystal having the damage layer prior to the chemically etching step.

12. The method of claim 1, further comprising the step of annealing the detached wave retarder plate for a time in the range of 6 to 10 hours at a temperature in the range of 400° C. to 900° C.

13. The method of claim 12, wherein the bulk crystal from which the wave retarder plate is detached is a $LiNbO_3$ crystal and the annealing is carried out in an ambient comprising oxygen.

14. The method of claim 12, wherein the bulk crystal from which the wave retarder plate is detached is a $LiNbO_3$ crystal and the annealing is carried out with the detached wave retarder plate placed on a $LiNbO_3$ substrate.

15. A method for fabricating a wave retarder plate from a bulk birefringent metal oxide crystal having a planar major surface oriented with respect to principal crystallographic axes of the bulk crystal such that a plane light wave normally incident of the planar major surface propagates in the bulk crystal in a first and a second mode of orthogonal polarization at velocities of $c_0/n_a$ and $c_0/n_b$, respectively, where $c_0$ is the velocity of the plane light wave in vacuum, $n_a$ is the index of refraction along a first mode axis of the bulk crystal, $n_b$ is the index of refraction along a second mode axis of the bulk crystal and $n_b>n_a$, the method comprising:

(a) implanting ions into the bulk crystal through the planar major surface in a direction perpendicular thereto to form a damage layer at an implantation depth d below the planar major surface of the bulk crystal, the planar major surface and the damage layer defining the wave retarder plate to be formed from the bulk crystal, the implantation depth d being given by the relation $$d = \frac{R\lambda}{[n_b(\lambda) - n_a(\lambda)]},$$

where R is the retardance of the wave retarder plate being formed and $\lambda$ is the wavelength of light for which the wave retarder plate is designed; and (b) exposing the bulk crystal having the damage layer to a rapid temperature increase to effect detachment of the wave retarder plate from the bulk crystal.

16. The method of claim 15, wherein the bulk crystal is one of $LiNbO_3$, $LiTaO_3$, $LiIO_3$, $\beta$-$BaB_2O_4$ and $LiB_3O_5$ crystals.

17. The method of claim 15, wherein R=0.25, and the wave retarder plate is a zeroth-order quarter-wave plate.

18. The method of claim 15, wherein R=0.5, and the wave retarder plate is a zeroth-order half-wave plate.

19. The method of claim 15, wherein the implanting step comprises generating a beam of ions having a characteristic energy level which determines the implantation depth, d.

20. The method of claim 15, wherein the ions are elemental ions.

21. The method of claim 15, wherein the ions are chemically reactive ions.

22. The method of claim 15, wherein said exposing step comprises:

(i) increasing the temperature of the bulk crystal having the damage layer from room temperature to a temperature within a first temperature range; and (ii) maintaining the temperature of said bulk crystal having the damage layer within said first temperature range to effect detachment of the wave retarder plate from the bulk crystal.

23. The method of claim 22, wherein the temperature increasing step is performed for less than 60 seconds.

24. The method of claim 22, wherein the temperature maintaining step is performed for approximately 10 seconds.

25. The method of claim 22, wherein the first temperature range is approximately 450° C. to 600° C.

26. The method of claim 22, wherein the temperature increasing step and the temperature maintaining step are carried out in an atmosphere comprising nitrogen and hydrogen gases.

27. The method of claim 15, further comprising the step of annealing the detached wave retarder plate for a time in the range of 6 to 10 hours at a temperature in the range of 400° C. to 900° C.

28. The method of claim 27, wherein the bulk crystal from which the wave retarder plate is detached is a $LiNbO_3$ crystal and the annealing is carried out in an atmosphere comprising oxygen.

29. The method of claim 27, wherein the bulk crystal from which the wave retarder plate is detached is a $LiNbO_3$ crystal and the annealing step is carried out with the detached wave retarder plate placed on a $LiNbO_3$ substrate.

30. A method for fabricating a wave retarder plate from a bulk birefringent metal oxide crystal having a planar major surface oriented with respect to principal crystallographic axes of the bulk crystal such that a plane light wave of normal incidence on the planar major surface propagates in the bulk crystal in a first and a second mode of orthogonal polarization at velocities of $c_0/n_a$ and $c_0/n_b$, respectively, where $c_0$ is the velocity of the plane light wave in vacuum, $n_a$ is the index of refraction along a first normal mode axis of the bulk crystal, $n_b$ is the index of refraction along a second normal mode axis of the bulk crystal and $n_b>n_a$, the method comprising:

(a) implanting ions into the bulk crystal through the planar major surface in a direction perpendicular thereto to form a damage layer at an implantation depth d below the planar major surface of the bulk crystal, the planar major surface and the damage layer defining the wave retarder plate to be formed from the bulk crystal, the implantation depth d being given by the relation $$d = \frac{R\lambda}{[n_b(\lambda) - n_a(\lambda)]},$$

where R is the optical retardance of the wave retarder plate being formed and $\lambda$ is the wavelength of light for which the wave retarder plate is designed;

(b) bonding the planar major surface of the bulk crystal having the damage layer to a first surface of a substrate; and (c) exposing the bulk crystal having the damage layer to a rapid temperature increase to effect detachment of the wave retarder plate from the bulk crystal.

31. The method of claim 30, wherein the birefringent bulk crystal is one of $LiNbO_3$, $LiTaO_3$, $LiIO_3$, $\beta$-$BaB_2O_4$ and $LiB_3O_5$ crystals.

32. The method of claim 30, wherein R=0.25, and the wave retarder plate is a zeroth-order quarter-wave plate.

33. The method of claim 30, wherein R=0.5, and the wave retarder plate is a zeroth-order half-wave plate.

34. The method of claim 30, wherein the implanting step comprises generating a beam of ions having a characteristic energy level which determines the implantation depth, d.

35. The method of claim 30, wherein the ions are elemental ions.

36. The method of claim 30, wherein the ions are reactive ions.

37. The method of claim 30, wherein the exposing step comprises:

(a) increasing the temperature of the bulk crystal having the damage layer from room temperature to a temperature within a first temperature range; and (b) maintaining the temperature of the bulk crystal having the damage layer within the first temperature range to effect detachment of the wave retarder plate from the bulk crystal.

38. The method of claim 37, wherein the temperature increasing step is performed for less than 60 seconds.

39. The method of claim 37, wherein the temperature maintaining step is performed for approximately 10 seconds.

40. The method of claim 37, wherein the first temperature range is approximately 450° C. to 600° C.

41. The method of claim 37, wherein the temperature increasing step and the temperature maintaining step are each carried out in an atmosphere comprising nitrogen and hydrogen.

42. The method of claim 30 further comprising:
(a) applying a high melting temperature bonding layer between the planar major surface of the bulk crystal having the damage layer and the first surface of the substrate; and
(b) removing the bonding layer after detachment of the wave retarder plate from the bulk crystal.

43. The method of claim 42 wherein the bonding layer has a melting temperature higher than a highest temperature to which the bulk crystal is exposed during the exposing step.

44. The method of claim 30, further comprising the step of annealing the detached wave retarder plate for a time in the range of 6 to 10 hours at a temperature in the range of 400° C. to 900° C.

45. The method of claim 44, wherein the bulk crystal from which the wave retarder plate is detached is a $LiNbO_3$ crystal and the annealing is carried out in an atmosphere comprising oxygen.

46. The method of claim 30, wherein the substrate has a first flat and polished major surface, and the bonding step comprises placing the planar major surface of the bulk crystal having the damage layer in contact with the first surface of the substrate, and subjecting the bulk crystal having the damage layer and the substrate to moderate heating while using a relatively light force to hold the planar major surface of the bulk crystal having the damage layer against the first surface of the substrate for a sufficiently long time to effect bonding of the bulk crystal having the damage layer to the substrate.

47. The method of claim 46, wherein the planar major surface of the bulk crystal is first polished to a relatively high degree of flatness before being ion implanted and being placed in contact with the first surface of the substrate.

48. The method of claim 46, wherein the planar major surface of the bulk crystal having the damage layer and the first surface of the substrate are both cleaned before being placed in contact with one another.

49. The method of claim 46, wherein the bulk crystal comprises a pyroelectric material.

50. The method of claim 46, wherein the substrate is of the same material as that of the bulk crystal.

51. The method of claim 46, wherein the substrate is a doped semiconductor crystal coated with a native oxide.

52. The method of claim 51, wherein the substrate is a doped silicon crystal coated with silicon dioxide.

53. The method of claim 46, wherein the bulk crystal from which the wave retarder plate is detached is a $LiNbO_3$ crystal and the material of the substrate is $LiNbO_3$.

54. The method of claim 46, wherein the bulk crystal from which the wave retarder plate is detached is a $LiNbO_3$ crystal and the material of the substrate is $LiTaO_3$.

55. The method of claim 46, wherein the moderate heating is carried out at a temperature in the range of 100° C. to 150° C.

56. The method of claim 55, wherein the bulk crystal having the damage layer is held against the substrate for a time in the range of 15 minutes to 30 minutes.

57. The method of claim 46, wherein after detachment of the wave retarder plate from the bulk crystal, the substrate having the detached wave retarder plate bonded thereto is immersed in methanol to effect release of the wave retarder plate from the substrate.

58. The method of claim 46, wherein after detachment of the wave retarder plate from the bulk crystal, the substrate having the detached wave retarder plate bonded thereto is immersed in water to effect release of the wave retarder plate from the substrate.

59. The method of claim 30, wherein the substrate is borosilicate glass having a first flat and polished surface, and the bonding step comprises placing the planar major surface of the bulk crystal having the damage layer in contact the first surface of the substrate, and placing the bulk crystal and the substrate between metal electrodes and applying pressure through the metal electrodes to hold the planar major surface of the bulk crystal against the first surface of the substrate while applying a high voltage between the bulk crystal and the substrate to effect anodic bonding between the planar major surface of the bulk crystal and the first surface of the substrate.

60. The method of claim 59, wherein the bulk crystal has a non-zero electrical conductivity.

61. The method of claim 59, wherein the planar major surface of the bulk crystal is first polished to a relatively high degree of flatness before being ion implanted and being placed in contact with the first surface of the borosilicate glass substrate.

62. The method of claim 59, wherein the planar major surface of the bulk crystal having the damage layer and the first surface of the borosilicate glass substrate are both cleaned before being placed in contact with one another.

63. The method of claim 59, wherein the high voltage applied between the bulk crystal and the borosilicate glass substrate is in the range of approximately 1 kV to 2 kV.

64. The method of claim 59, wherein after detachment of the wave retarder plate from the bulk crystal, the borosilicate glass substrate having the detached wave retarder plate bonded thereto is immersed in methanol to effect release of the detached wave retarder plate.

65. The method of claim 59, wherein after detachment of the wave retarder plate from the bulk crystal, the borosilicate glass substrate having the detached wave retarder plate bonded thereto is immersed in water to effect release of the detached wave retarder plate from the substrate.

66. The method of claim 59, wherein after detachment of the wave retarder plate from the bulk crystal, the borosilicate glass substrate is removed by etching to effect release of the detached wave retarder plate from the substrate.

67. The method of claim 66, wherein the detached wave retarder plate is encapsulated during removal of the borosilicate glass substrate by etching.

68. The method of claim 57, 58, 64, 65 or 66, wherein the released wave retarder plate is subjected to annealing at a temperature in the range of 400° C. to 900° C. for a period of time in the range of 6 to 10 hours.

69. The method of claim 57, 58, 64, 65 or 66, wherein the bulk crystal is a $LiNbO_3$ crystal, and the released wave retarder plate is subjected to annealing at a temperature in the range of 400° C. to 900° C. for a period of time in the range of 6 to 10 hours in an atmosphere comprising oxygen.

70. The method of claim 57, 58, 64, 65 or 66, wherein the bulk crystal from which the wave retarder plate is detached is a $LiNbO_3$ crystal, and the released wave retarder plate is subject to annealing at a temperature in the range of 400° C. to 900° C. for a time in the range of 6 to 10 hours in an atmosphere of oxygen, and wherein the annealing is carried out with the detached wave retarder plate placed on a $LiNbO_3$ substrate.

71. The method of claim 46 or 59, wherein the bulk crystal is a LiNbO$_3$ crystal and the implanting step includes implanting the bulk crystal at normal incidence through the planar major surface thereof with helium ions at a dose of approximately 2.25×10$^{16}$ cm$^{-2}$ at an energy of approximately 3.8 MeV, and wherein the exposing step includes exposing the bulk crystal having the damage layer to a temperature increase from approximately room temperature to a temperature in the range of 400° C. to 500° C. and maintained at the temperature for a period of 5 sec to 10 sec in an atmosphere comprising nitrogen and hydrogen to effect detachment of the wave retarder plate from the bulk crystal.

72. An optical waveguide polarization mode converter comprising:

(a) a section of optical waveguide supporting both TE and TM modes of propagation, and having a groove formed therein perpendicular to the direction of light propagation in the optical waveguide section; and (b) a zeroth-order LiNbO$_3$ wave retarder plate having an optical retardance of R=0.5 formed by the method of claim 1, 15, 30, 46 or 59 mounted in the groove of the section of optical waveguide, the wave retarder plate having first and second normal mode axes oriented at 45° with respect to the direction of the electric field vector of a TE or TM mode of propagation in the section of the optical waveguide.

73. An optical waveguide polarization mode converter comprising:

(a) a section of optical waveguide supporting either TE or TM, or both TE and TM modes of propagation and having a front-end facet through which optical waves enter the section of optical waveguide, and (b) a zeroth-order LiNbO$_3$ wave retarder plate having an optical retardance of R=0.5 formed by the method of claim 1, 15, 30, 46 or 59 bonded to the front-end facet of the section of optical waveguide, the wave retarder plate having first and second normal mode axes oriented at 45° with respect to the direction of the electric field vector of a TE or TM mode of propagation in the section of the optical waveguide.

74. An optical waveguide polarization mode converter comprising:

(a) a section of optical waveguide supporting either TE or TM, or both TE and TM modes of propagation and having a rear-end facet through which optical waves propagate from the section of optical waveguide; and (b) a zeroth-order LiNbO$_3$ wave retarder plate having an optical retardance of R=0.5 formed by the method of claim 1, 15, 30, 46 or 59 bonded to the rear-end facet of the section of optical waveguide, the wave retarder plate having first and second normal mode axes oriented at 45° with respect to the direction of the electric field vector of a TE or TM mode of propagation in the section of the optical waveguide.

\* \* \* \* \*

UNITED STATES PATENT AND TRADEMARK OFFICE
CERTIFICATE OF CORRECTION

PATENT NO. : 6,641,662 B2
DATED : August 24, 2004
INVENTOR(S) : Radojevic et al.

It is certified that error appears in the above-identified patent and that said Letters Patent is hereby corrected as shown below:

Title page,
Item [56], References Cited, OTHER PUBLICATIONS, "Levy et al.," reference "fabricationof" should read -- fabrication of --
Item [57], ABSTRACT,
Line 18, "wageguide" should read -- waveguide --
Line 23, "plate is" should read -- plate are --

Column 1,
Line 9, "Jul. 8, 2000" should read -- Jul. 18, 2000 --
Line 49, "velocites" should read -- velocities --
Line 63, Equation (1), "$N_a$" should read -- $n_a$ --

Column 2,
Line 7, "plane" should read -- planar --
Line 14, "$c_0/n$," should read -- $c_0/n_1$ --
Line 15, "c0/n," should read -- $c_0 n_1$ --
Line 47, "zeroth order" should read -- zeroth-order --

Column 3,
Line 39, "ultra thin" should read -- ultra-thin --

Column 5,
Line 10, "zeroth order" should read -- zeroth-order --
Line 28, "therein." should read -- therein; --

Column 7,
Line 20, "tranmission" should read -- transmission --
Line 48, "FIG. 22b" should read -- FIG. 22B --
Line 54, "45" should read -- 45° --

Column 8,
Line 20, "zeroth" should read -- zeroth- --

Column 11,
Line 25, "80" should read -- 80 -- (boldface)
Line 48, "90" should read -- 90 -- (boldface)

Column 13,
Line 61, "are" should read -- is --

UNITED STATES PATENT AND TRADEMARK OFFICE
CERTIFICATE OF CORRECTION

PATENT NO. : 6,641,662 B2
DATED : August 24, 2004
INVENTOR(S) : Radojevic et al.

It is certified that error appears in the above-identified patent and that said Letters Patent is hereby corrected as shown below:

Column 14,
Line 57, "tht" should read -- that --

Column 16,
Line 6, "are" should read -- is --

Column 18,
Line 4, "are" should read -- is --
Line 10, "FIG. 12" should read -- FIG. 13 --
Line 42, "Advantaeously" should read -- Advantageously --

Column 19,
Line 29, "20×objective" should read -- 20 × objective --
Line 67, "1.98±±0.02." should read -- 1.98±0.02. --

Column 20,
Line 6, "with out" shoud read -- without --
Line 38, "db." should read -- dB. --

Column 21,
Line 45, "are" should read -- is --
Line 51, "45" should read -- 45° --
Line 54, "FIG. 22b" should read -- FIG. 22B --

Column 26,
Line 12, "contact the" should read -- contact with the --

Signed and Sealed this

Twenty-second Day of March, 2005

JON W. DUDAS
*Director of the United States Patent and Trademark Office*